United States Patent [19]
Aoike

[11] Patent Number: 5,961,726
[45] Date of Patent: Oct. 5, 1999

[54] DEPOSITED FILM FORMING APPARATUS AND ELECTRODE FOR USE IN IT

[75] Inventor: Tatsuyuki Aoike, Nara, Japan

[73] Assignee: Canon Kabushiki Kaisha, Tokyo, Japan

[21] Appl. No.: 08/577,816

[22] Filed: Dec. 22, 1995

[30] Foreign Application Priority Data

Dec. 26, 1994 [JP] Japan .................................. 6-323007
Dec. 18, 1995 [JP] Japan .................................. 7-328719

[51] Int. Cl.$^6$ ............................................. C23C 16/00
[52] U.S. Cl. .............................. 118/723 E; 118/723 ME; 118/723 MP; 118/723 MW; 118/730
[58] Field of Search .................................. 118/723 MW, 118/723 ME, 723 MP, 723 R, 715, 724, 725; 156/345

[56] References Cited

U.S. PATENT DOCUMENTS

| | | | |
|---|---|---|---|
| 4,491,496 | 1/1985 | Laporte et al. | 156/345 |
| 4,513,815 | 4/1985 | Rundell et al. | 166/57 |
| 4,566,403 | 1/1986 | Fournier | 118/718 |
| 4,972,799 | 11/1990 | Misumi et al. | 118/723 |
| 5,129,359 | 7/1992 | Takei et al. | 118/723 |
| 5,209,182 | 5/1993 | Ohta et al. | 118/666 |
| 5,433,790 | 7/1995 | Niino et al. | 118/723 MW |
| 5,443,645 | 8/1995 | Otoshi et al. | 118/718 |
| 5,527,391 | 6/1996 | Echizen et al. | 118/719 |
| 5,527,396 | 6/1996 | Saitoh et al. | 118/723 MP |
| 5,534,070 | 7/1996 | Okamura et al. | 118/723 E |
| 5,536,914 | 7/1996 | Pelletier et al. | 219/121.48 |

FOREIGN PATENT DOCUMENTS

| | | |
|---|---|---|
| A0109808 | 5/1984 | European Pat. Off. . |
| 0115970 | 8/1984 | European Pat. Off. . |
| A0594453 | 4/1994 | European Pat. Off. . |
| A0613329 | 8/1994 | European Pat. Off. . |
| 3401791 | 8/1985 | Germany . |
| 60-168156 | 8/1985 | Japan . |
| 60-178457 | 9/1985 | Japan . |
| 60-225854 | 11/1985 | Japan . |
| 2180703 | 7/1990 | Japan . |
| 04099282 | 3/1992 | Japan . |

*Primary Examiner*—Cecilia J. Tsang
*Assistant Examiner*—Abdel A. Mohamed
*Attorney, Agent, or Firm*—Fitzpatrick, Cella, Harper & Scinto

[57] ABSTRACT

The deposited film forming apparatus of the present invention capable of forming a deposited film having a small number of structural defects and a light-receiving member for electrophotography for forming a light-receiving member for electrophotography having excellent image characteristics, which comprises means for supplying a source gas into a reaction vessel capable of reducing a pressure in which said substrate is arranged, and high-frequency power supply means for supplying a high-frequency power into said reaction vessel in which said substrate is arranged, the source gas being decomposed by the high-frequency power to be able to form a deposited film on the substrate, wherein a supply portion of said high-frequency power supply means is constituted by a plurality of members.

47 Claims, 11 Drawing Sheets

SOURCE GAS

SOURCE GAS

SOURCE GAS

DEPOSITED FILM FORMING APPARATUS AND ELECTRODE FOR USE IN IT

BACKGROUND OF THE INVENTION

1. Field of the Invention

The present invention relates to a deposited film forming apparatus in which a deposited film, in particular, a functional deposited film, especially, an amorphous semiconductor film capable of using in a semiconductor device, a light-receiving member for electrophotography, a line sensor for inputting an image, an image pickup device, a photovoltaic device, or the like is formed on a cylindrical conductive substrate by plasma CVD, and it also relates to an electrode for use in the apparatus.

2. Related Background Art

As materials useful for semiconductor devices including thin film transistors, light-receiving members for electrophotography, line sensors for inputting an image, image pickup devices, photovoltaic devices, or various types of electronics elements, non-single-crystal materials, in particular, amorphous materials such as amorphous silicon (e.g., amorphous silicon compensated by hydrogen or/and a halogen), amorphous silicon nitrides, amorphous silicon carbides, and amorphous silicon oxides are known. Some of the semiconductor devices prepared by utilizing a deposited film comprising the materials as mentioned above are practically used.

However, among these devices, there are some points to be improved in production of devices, characteristics of a deposited film, costs in production, or the like. For example, when a light-receiving member (photosensitive member) for electrophotography is to be manufactured, since the surface of a substrate for the photosensitive member has a relatively large area, it requires that a deposited film is uniformly formed in a thickness and electrical characteristics with a small number of film defects over the substrate. Further, a deposited film forming apparatus which can assure sufficient productivity and yield is demanded in order to satisfy a requirement of higher characteristics in recent years.

One example of an apparatus for forming such a deposited film is shown in FIGS. 1A and 1B. FIG. 1A is a transverse sectional view illustrating the deposited film forming apparatus. FIG. 1B is a longitudinal sectional view illustrating the deposited film forming apparatus.

In FIGS. 1A and 1B, reference numeral 700 denotes a reaction vessel. The reaction vessel 700 is connected to an exhausting apparatus (not shown) capable of exhausting a gas and the like inside the vessel through an exhaust pipe 705. A source gas for film formation such as a silane gas, a methane gas, a diborane gas, a phosphine gas or the like is supplied from a source gas supply pipe 703 connected to a source gas supply system (not shown) constituted by a bomb, a pressure adjuster, a mass-flow controller, a valve, and the like into a space (internal chamber) 702 surrounded by substrates 701. (In FIG. 1A, eight cylindrical substrates 701 are arranged at an equal distance on the same circumference.)

An exhaust amount is adjusted to generally set a gas pressure in the space 702 to be a desired pressure of $1 \times 10^{-2}$ to 1,000 Pa.

A microwave power source (not shown) supplies a microwave power of, e.g., 2.45 GHz, into the space 702 through an isolator (not shown), a wave guide 707, and a microwave supply window 706 to generate glow discharge in the space 702, thereby forming a deposited film on each substrate 701.

The substrate 701 is supported by a rotating shaft 708 through a holder (not shown). The rotating shaft is connected to a motor 709 through a gear 710. The substrate is rotated by the motor to form a uniform deposited film on the substrate 701.

The substrate 701 is heated by a heater 704 to a temperature of, e.g., 100° C. to 400° C., required to form a deposited film.

As a deposited film forming apparatus in which the above problems are solved, a deposited film forming apparatus by a plasma CVD method using a microwave is disclosed in U.S. Pat. No. 5,129,359. They disclose a deposited film forming apparatus having the following arrangement. A substrate, a microwave supply means, and a source gas supply means are arranged in a reaction vessel, and an electric field is applied across the source gas supply means and the substrate, thereby improving uniformity of the film thickness and electric characteristics.

The present inventor found probability that the performance of a deposited film is improved by applying a high-frequency power across the source gas supply means and the substrate in the deposited film forming apparatus described above, and examined this probability. In this case, although electric performance was improved, structural defects do not decrease in number. As a result, to further improve the total performance of the deposited film, some points to be improved are remained.

In particular, in a recent electrophotographic apparatus, not only a character image but also a photographic image must be faithfully copied, and further improvement in image characteristics such as improvement in reproducibility of an intermediate density image is demanded. For this purpose, a faithful latent image is formed on the basis of an original image, and the latent image is developed by using a developer having a small grain size, so as to improve the resolution and reproducibility of the electrophotographic apparatus. As a result, it is required for a deposited film serving as, e.g., a light-receiving member for electrophotography that stable formation of a high dark portion potential, further improvement in electric characteristics having sensitivity which accurately reacts with image exposure, and a reduction in the number of image defects corresponding to improvement in resolution of electrophotographic apparatus, i.e., a reduction in the number of structural defects which cause image defects, are called globular projections, are carried out. In the deposited film forming apparatus described above, there are some points to be improved in formation of a deposited film satisfying the demand of further improvement in total performance of the deposited film.

SUMMARY OF THE INVENTION

An object of the present invention is to solve the above problems, and provide a deposited film forming apparatus capable of reducing the number of structural defects in a deposited film, and an electrode for use in the apparatus.

Another object of the present invention is to provide a deposited film forming apparatus suitable for forming a light-receiving member for electrophotography having excellent image characteristics, and an electrode for use in the apparatus.

Still another object of the present invention is to provide a deposited film forming apparatus capable of forming a deposited film with uniform and excellent characteristics and quality, and an electrode for use in the apparatus.

A further object of the present invention is to provide a deposited film forming apparatus capable of stably forming a deposited film substantially with a uniform film thickness and thereby reducing a production cost to carry out film formation at a low cost, and an electrode for use in the apparatus.

A still further object of the present invention is to provide a deposited film forming apparatus comprising a reaction vessel means for supplying a source gas into a reaction vessel capable of reducing a pressure in which a substrate is arranged, and high-frequency power supply means for supplying a high-frequency power into the reaction vessel, the source gas being decomposed by the high-frequency power to form a deposited film on the substrate, wherein a supply portion of the high-frequency power supply means is constituted by a member comprising a plurality of materials; and an electrode for use in the apparatus.

A still further object of the present invention is to provide an electrode for use in a vacuum apparatus capable of decomposing a source gas by supply of high-frequency power to form a deposited film, which comprises a conductive material and an insulating material covering at least a part of the surface of the conductive material.

DETAILED DESCRIPTION OF THE PREFERRED EMBODIMENTS

Figure 1A:
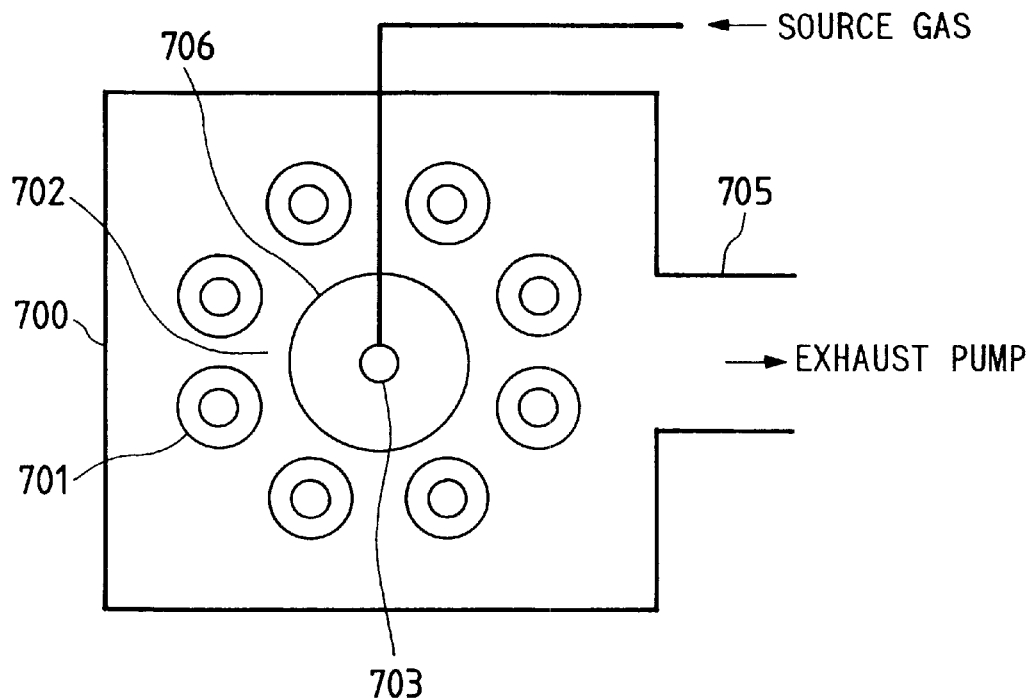
FIG. 1A is a transverse sectional view illustrating one example of the constitution of a deposited film forming apparatus.

The present invention is based on finding of the specific constitution of an electrode for supplying a high-frequency power into the reaction vessel of a deposited film forming apparatus, i.e., a high-frequency power supply means, and possibility of achieving the above-described objects by a deposited film forming apparatus comprising the specific constitution of the electrode.

The electrode for supplying a high-frequency, i.e., the high-frequency power supply means (high-frequency supply portion) comprises a conductive member and an insulating member covering the surface of the conductive member.

The high-frequency power supply portion preferably comprises a conductive member serving as a base member, the surface thereof being covered with a material having high adhesion to a deposited film, in particular, a ceramics material.

As the ceramics material, one or more of $Al_2O_3$, BN, AlN, $ZrSiO_4$, $TiO_2$, $Cr_2O_3$, and MgO are preferably used. These materials may be adhered to the surface of the conductive base member by plasma spraying. The conductive material may be covered with a case-like covering formed of these ceramics materials.

As the conductive member of the high-frequency power supply portion, one or more kinds of stainless steel, aluminum, titanium, nickel and Inconel (i.e., alloy of Ni, Cr and Fe) are preferably used.

An annular conductor may be arranged around the conductive member as described above. The annular conductor preferably has a ring or a spiral shape. The annular conductor may be provided in plural number or grounded on the earth.

The frequency of the high-frequency power is preferably set to be 20 MHz to 450 MHz, more preferably 31 MHz to 450 MHz, most preferably 50 MHz to 450 MHz. A microwave power may be supplied together with the high-frequency power.

In addition, the high-frequency power supply portion may be also used as the source gas supply means. A mechanism for heating or cooling the high-frequency power supply portion is preferably arranged. The electrode serving as the high-frequency supply portion may be provided in plural number in one reaction vessel.

In the above arrangement, the high-frequency power supply portion has a conductive member as a base member, and its surface consists of an insulating material such as a ceramic material. For this reason, a deposited film, having a small number of structural defects, for a light-receiving member for electrophotography having excellent image characteristics can be advantageously formed.

Further, an annular conductor may be provided around a conductive member and covered with the insulating material as described above. This makes it possible to improve uniformity of discharge, thereby improving uniformity of characteristics and film thickness of a deposited film.

Progress of completion of the present invention and effects of the present invention will be described below.

The deposited film forming apparatus, as disclosed in U.S. Pat. No. 5,129,359 employed a constitution in which a microwave power is supplied into a discharge space formed in an arrangement circle of cylindrical conductive substrates, and a DC electric field is applied across source gas supply means and the substrates in the discharge space.

The present inventor examined the apparatus having the constitution in which a high-frequency power supply means is arranged in the discharge space as described above, and the high-frequency power is applied across the high-frequency power supply portion and the substrates to generate discharge to decompose a source gas, thereby forming a deposited film on each of the substrates. As a result, although a deposited film. having excellent electric characteristics could be obtained in the method as described above, the number of structural defects called globular projections in the deposited film could not be easily reduced to a satisfactorily low level.

When the present inventor investigated a cause of formation of the structural defects called globular projections in the deposited film, it was confirmed that globular projections began to grow by using attachments on the substrate surface as cores.

Conventionally, a substrate before film formation is strictly cleaned and conveyed from an environment such as a clean room in which dust management is performed into a deposited film forming apparatus, so that dust is avoided from adhering to the substrate as hard as possible. In this manner, although the substrate is conveyed into the deposited film forming apparatus while keeping it clean, there is a cause of adhering of dust in the deposited film forming apparatus.

More specifically, a source gas is supplied into a discharge space, a high-frequency power is supplied into the discharge space from the high-frequency power supply portion to decompose a source gas in the discharge space, thereby forming a deposited film on each substrate. In this case, the deposited film is also deposited, e.g., on the surface of the high-frequency power supply portion. The deposited film receives its stress during formation of the deposited film or energy caused by an ion potential in the discharge space to store stress strain. The present inventor has found that when the deposited film stores the stress strain at a predetermined level or more, the deposited film is peeled as deposited film pieces from the high-frequency power supply portion surface, and the deposited film pieces are diffused in the discharge space, whereby some deposited film pieces adhere to the substrate to contaminate a deposited film on the substrate.

Further, as the results of studying the cause that uniformity of characteristics of a deposited film is not necessarily in a satisfactory level, the present inventor has found that this non-uniformity of the characteristics is due to non-uniformity of discharge from a high-frequency supply. Though the non-uniformity of this discharge is present in the prior art, this becomes a large factor depending on the large improvement of characteristics of a deposited film. It is considered that the non-uniformity of this discharge is due to non-uniformity of high-frequency power distribution on the surface of a high-frequency supply portion. It seems that this cause is due to a non-negligible level of capacitance effect between a high-frequency supply portion and a substrate when a high-frequency power is used, and generation of discharge strength distribution in a discharge space depending resonance conditions by formation of a series resonance circuit of inductance and capacitance in the discharge space.

The present inventor, on the basis of the above viewpoint, examined an apparatus constitution in which adhesion of the deposited film on the high-frequency power supply portion to the surface of the high-frequency power supply portion was increased, the deposited film difficultly received an influence of energy caused by the ion potential from the discharge space and it is difficult to peel the deposited film on the high-frequency power supply portion, thereby reducing the number of image defects. As a result, the present invention has been completed.

More specifically, the high-frequency power supply portion arranged in the discharge space comprises a conductive member as a base member, and an insulating material such as a ceramics material formed on the surface of the conductive material, so that the number of films peeled from the high-frequency power supply portion can be reduced. Therefore, the number of structural defects of the deposited film can be reduced.

As the results of study of an apparatus capable of making uniformity of characteristics, the present invention has accomplished by studying the constitution of a high-frequency supply portion in order to make it possible to generate an uniform discharge distribution from the high-frequency supply portion.

According to the forming apparatus of the present invention, since the surface of the base member of the high-frequency power supply portion is covered with a ceramics material, adhesion between the surface and the deposited film increases because ceramics has surface energy larger than that of a metal, and the number of films peeled from the high-frequency power supply portion is reduced.

In addition, since the ceramics is an insulating material, the ceramics does not easily receives energy caused by the ion potential in the discharge space, and strain stored in the deposited film can be reduced to reduce peeling of a deposited film from the ceramics.

Since the ceramics has a high hardness, dust does not easily adhere to the surface of the ceramics. This high hardness is a factor of a reduction in dust.

The present inventor examined a high-frequency power supply portion having a surface consisting of a ceramics material, the electric characteristics of a deposited film, in particular, travelling of carriers in the deposited film was improved. It was found that the reproducibility of an intermediate image density was improved when the deposited film was used as a light-receiving member for electrophotography. Although the cause of this is not clear, it is estimated that a plasma potential in the discharge space changes by covering the electrode surface with the ceramics material, thereby obtaining a deposited film having better quality.

Further, in the present invention, by providing a conductive annular conductor in at least one region of the insulating covering layer, it is possible to generate a more uniform discharge distribution, thereby forming a deposited film with more uniform characteristics.

It is considered that, by providing the conductive annular conductor in the insulating covering layer, inductance of a high-frequency electrode and capacitance between the high-frequency electrode and a substrate is varied to be able to obtain a desired discharge distribution, and therefore make a discharge distribution more uniform.

The inventor also found that when the surface of the high-frequency electrode was covered with the insulating covering layer and the conductive annular conductor was provided in the covering layer, electric characteristics of a deposited film, particularly travelling of carriers in the deposited film was improved, and in use for a light-receiving member for electrophotography the reproducibility of an intermediate image density was improved. Although this cause is not clear, it is estimated that, by covering the electrode surface with the insulating covering layer and providing the conductive annular conductor in the covering layer, a plasma potential in the discharge space changes due to uniformity of sheath by plasma, thereby obtaining a deposited film with better quality.

The frequency of the high-frequency power supplied into the discharge space is not limited. However, according to the experiment by the present inventor, when the frequency was lower than 20 MHz, discharge became unstable depending on conditions, conditions of formation of a deposited film might be limited. In addition, the frequency exceeded 450 MHz, transmitting characteristics of a high frequency power were degraded to, in some cases, difficultly generate glow discharge itself. Therefore, in the present invention, the used frequency preferably is within a range of 20 MHz to 450 MHz, more preferably 31 MHz to 450 MHz, most preferably 50 MHz to 450 MHz.

Although the waveform of the high-frequency power is not limited, a sine waveform, a rectangular waveform, or the like is preferred. Although the magnitude of the high-frequency power is properly determined on the basis of the characteristics or the like of a target deposited film, a high-frequency power of 10 to 5,000 W is desirably applied to each substrate. In particular, the high-frequency power is more desirably set to be 20 to 2,000 W.

As the material of the conductive member of the high-frequency power supply portion used in the present invention, basically, any conductive material may be used. As the material, for example, a metal such as Al, Fe, Ni, Cr, Ti, Mo, Au, In, Nb, Te, V, Pt, or Pb and an alloy of these metals such as stainless steel or Inconel may be used. In addition, glass, ceramics, or the like having a surface which is processed to have conductivity can also be used.

Though the insulating material of the high-frequency power supply, portion in the present invention is not limited, a ceramics material is preferred. For example, $Al_2O_3$, BN, AlN, $ZrSiO_4$, $TiO_2$, $Cr_2O_3$, MgO, or a mixture thereof is available. Among them, a material such as $Al_2O_3$ or $TiO_2$ having a high acid resistance is preferably used because the material has a high corrosion resistance to a compound gas containing, e.g., halogen atoms, to be used in the step of manufacturing a deposited film.

Although a means for covering the surface of the conductive base member of the high-frequency power supply portion with a ceramics material is not limited to a specific means, a surface coating method such as CVD, plating, or a spraying means method is preferably available. Especially, the spraying means is preferably used because of its cost or because the spraying means is not easily limited by the size and shape of an object to be coated. In particular, a plasma spraying method is preferably used because of low porosity or preferable adhesion. For example, a cylinder member consisting of a ceramics material may be formed and then arranged to adhere to the surface of the conductive base member of the high-frequency power supply portion.

When the surface of the conductive base member of the high-frequency power supply portion is covered with a ceramics material, the surface is subjected to a cleaning process, and the ceramics material is formed on the surface of the conductive base member by the above means. In order to improve the adhesion, an underlying layer consisting of a mixture of, e.g., Al and Ti, is preferably formed between the ceramics material and the surface of the conductive base member.

Although the ceramics material preferably covers the entire surface of the high-frequency power supply portion, an uncovered portion used for connection to the high-frequency power supply portion may be formed on a part of the surface of the high-frequency power supply portion.

The thickness of the ceramic material constituting the surface of the high-frequency power supply portion is not limited to a specific value. However, in order to improve durability and uniformity, the thickness is preferably 1 $\mu$m to 10 mm in consideration of manufacturing cost, more preferably, 10 $\mu$m to 5 mm.

Although the shape of the high-frequency power supply portion is not limited to a specific shape, a cylindrical high-frequency power supply portion is optimally used in the present invention. When the size of the high-frequency power supply portion is excessively small, the effect of the present invention is not easily obtained; and when the size is excessively large, deposition adhered to the high-frequency power supply portion increases in amount, and a rate of deposition on a substrate is decreased. In addition, discharge may be disturbed depending on conditions. The sectional area of the high-frequency power supply portion of the present invention is preferably about $\frac{1}{100}$ to $\frac{1}{10}$ that of the discharge space. The length of the high-frequency power supply portion is preferably set to be larger than the length of the substrate by about 1% to 10%. The length of the high-frequency power supply portion smaller than that of the substrate is effective in the present invention.

In the case of the annular conductor in the present invention, as the material of the annular conductor, any conductive material may be used. For example, a metal such as Al, Fe, Ni, Cr, Ti, Mo, Au, In, Nb, Te, V, Pt, and Pb, and an alloy thereof such as stainless steel and Inconel may be used.

Although the shape of the annular conductor is not limited, in order to provide it in the covering layer, a ring or a spiral shape is preferred.

Furthermore, when a plurality of high-frequency power supply portions are arranged in the discharge space, a discharge distribution in the discharge space can be further optimized.

When a means for heating or cooling the high-frequency power supply portion is arranged, adhesion between the high-frequency power supply portion and the deposited film can be improved, and the deposited film can be prevented from being peeled. It can be suitably determined on the basis of a combination between the deposited film material and the ceramics material of the surface of the high-frequency power supply portion whether the high-frequency power supply portion is heated or cooled.

As the material of the source gas supply portion used in the present invention, any conductive material may be used. As this material, a metal such as Al, Fe, Cr, Ni, Ti, Mo, Au, In, Nb, Te, V, Pt, or Pb or an alloy thereof such as stainless steel or Inconel is available. An insulating material such as glass, ceramics, or the like is also used as the material. When the glass, ceramics, or the like is used, its surface may be processed to have conductivity if necessary. As the ceramics material, for example, $Al_2O_3$, BN, AlN, $ZrSiO_4$, $TiO_2$, $Cr_2O_3$, MgO or the like, or a composite material thereof may also be used.

A ceramics material having good adhesion to a deposited film may be used on at least the surface of the source gas supply portion in view of inhibiting the peeling of the deposited film attached on the surface.

The shape of the source gas supply portion is not limited to a specific shape. However, a cylindrical source gas supply portion is preferably used. When the diameter of the section of the cylindrical source gas supply portion is set to be preferably 3 mm or more. Especially, the diameter optimally falls within a range of 5 mm to 20 mm.

The direction of a gas discharge holes formed in the source gas supply portion is not limited, provided that an uniform distribution of a supplied gas is possibly formed in a discharge space. A gas is discharged preferably from each the discharge hole. The gas discharge holes have preferably directions for diffusing a source gas in the entire discharge space. Otherwise, the source gas supply portion itself consists of a porous material to uniformly discharge a gas in all directions.

By providing a plurality of source gas supply portions in a discharge space, the distribution of a source gas in the discharge space can also be made more uniform.

In the present invention, a means for supplying a microwave power may be arranged in the discharge space. When the microwave power is supplied, a rate of deposition can be increased without degrading the characteristics of the deposited film. For this reason, a deposited film forming apparatus having high productivity can be obtained. As the means for supplying the microwave power, a means for supplying a microwave which is introduced from the directions of both the ends of the substrate is generally used.

As the material of a microwave supply window, a material having a low microwave energy loss is preferably used. In addition, since the discharge space must be kept in a vacuum state, alumina ceramics, aluminum nitride, boron nitride, silicon oxide, silicon carbide, silicon nitride, Teflon, polystyrene, or the like can be used.

The frequency of a microwave power supplied into the discharge space is preferably set to be 500 MHz or more, preferably, 2.45 GHz.

Although the magnitude of the microwave power is properly determined on the basis of the characteristics or the like of a target deposited film, a microwave power of 10 to 5,000 W is desirably applied to each substrate. In particular, the microwave power is more desirably set to be 20 to 2,000 W.

Preferred examples of a deposited film forming apparatus and a high-frequency power supply portion according to the present invention will be described in further detail below with reference to the accompanying drawings.

FIGS. 2A, 2B, 3A and 3B are sectional views for illustrating one example of a deposited film forming apparatus and a high-frequency power supply portion according to the present invention.

Figure 2A:
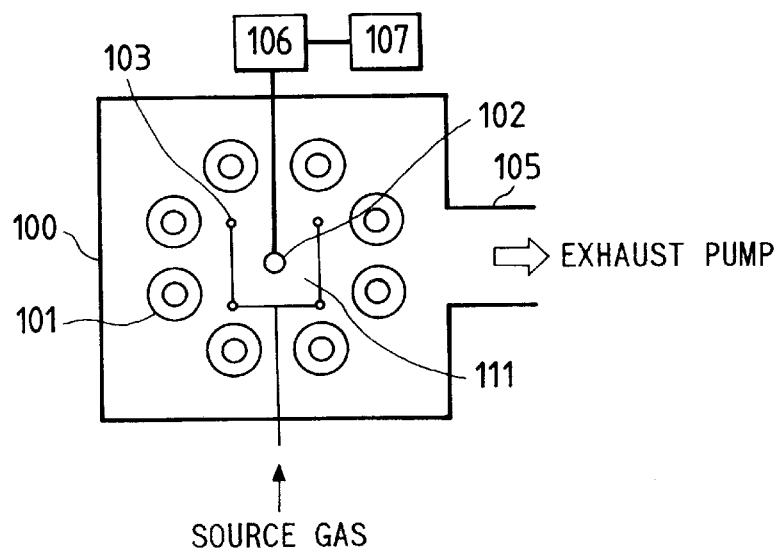
FIGS. 2A, 4A, 7A, 10A and 19A are transverse sectional views illustrating preferable examples of the constitution of the deposited film forming apparatus of the present invention.
Figure 2B:
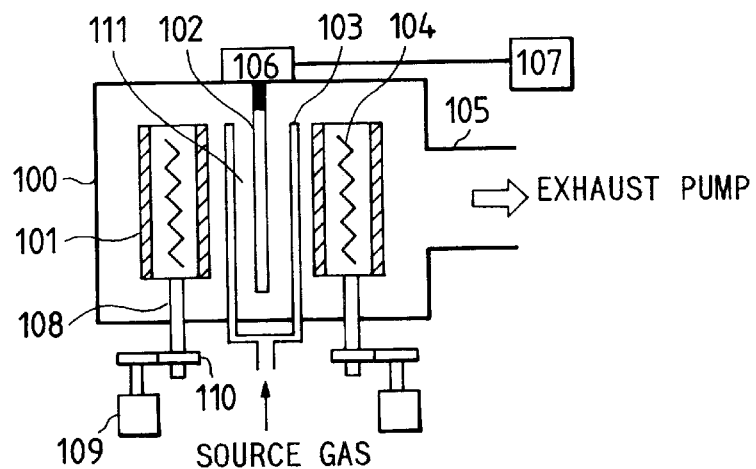
FIGS. 2B, 4B, 7B and 10B are longitudinal views illustrating the apparatuses as shown in FIGS. 2A, 4A, 7A and 10A, respectively.
Figure 3A:
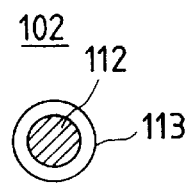
FIGS. 3A, 5A, 8A, 9A, 11A, 12A, 15A, 17A and 18A are transverse sectional views illustrating preferable examples of the electrode of the present invention for supply of high-frequency.
Figure 3B:
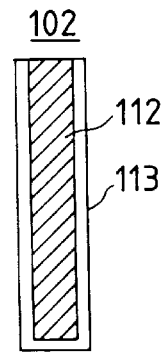
FIGS. 3B, 5B, 8B, 9B, 11B, 12B, 13, 14, 15B, 16, 17B, 18B and 19B are longitudinal views illustrating preferable examples of the electrode of the present invention.

FIG. 2A is a transverse sectional view showing the apparatus of the present invention. FIG. 2B is a longitudinal sectional view showing the apparatus in FIG. 2A. FIG. 3A is a transverse sectional view showing a high-frequency power supply portion of the apparatus in FIG. 2A. FIG. 3B is a longitudinal sectional view showing the high-frequency power supply portion in FIG. 3A.

In FIGS. 2A and 2B, reference numeral 100 denotes a reaction vessel. The reaction vessel 100 is connected to an exhausting apparatus (not shown) through an exhaust pipe 105. The shape of the reaction vessel 100 is not limited, provided that it is necessary to have a vacuum airtight structure. A cylindrical or cubical shape is generally used. Though the material of the reaction vessel 100 is not limited, a metal such as Al or stainless steel is desirably used from a viewpoint of a mechanical strength, prevention of leakage of a high-frequency power, or the like.

A source gas is supplied from a source gas supply pipe 103 connected to a source gas supply system (not shown) constituted by a bomb, a pressure adjuster, a mass-flow controller, a valve, and the like into an internal chamber 111 surrounded and formed by substrates 101.

A high-frequency power supply portion (high-frequency electrode) 102 as shown in FIGS. 3A and 3B is formed by covering the surface of a conductive material 112 with an insulating material as a ceramic material 113. The high-frequency power supply portion is connected to a high-frequency power supply 107 through a matching box 106. When a high-frequency power is applied across the high-frequency electrode 102 and the substrate 101, glow discharge is generated in the internal chamber 111. The substrate 101 is supported by a rotating shaft 108 through a holder (not shown). The rotating shaft 108 is connected to a motor 109 through a gear 110. When the substrate is rotated by the motor, a uniform deposited film is formed on the substrate 101.

The substrate 101 may be heated by a heater 104 to a temperature required to form a deposited film.

Procedures of deposited film formation using the apparatus in FIGS. 2A and 2B will be described below. The deposited film formation using this apparatus is performed in the following manner.

The substrates 101 which are degreased and cleaned in advance are arranged in the reaction vessel 100, and the reaction vessel 100 is evacuated by an exhausting apparatus (e.g., a vacuum pump) (not shown). The temperature of the substrates 101 is controlled by the heater 104 to a desired temperature of preferably 20° C. to 500° C., more preferably 50° C. to 400° C., while the substrates 101 are rotated.

When the substrates 101 reaches a desired temperature, a source gas from a source gas supply system (not shown) is supplied into the internal chamber 111 through the source gas supply pipe 103. At this time, attention must be paid to an extreme variation in pressure such as spouting of the gas. When the source gas is adjusted to a predetermined flow rate, an exhaust valve (not shown) is adjusted while watching a vacuum gauge (not shown) to obtain a desired internal pressure.

When the internal pressure is stable, the high-frequency power supply 107 is adjusted to a desired power to apply a high-frequency power to the high-frequency electrode 102 through the matching box 106, thereby generating glow discharge. The source gas supplied into the reaction vessel 100 is decomposed by the discharge energy, thereby forming a predetermined deposited film on each of the substrates 101. After the deposited film is formed to have a desired thickness, supply of the high-frequency power is stopped, and the flow of the source gas into the reaction vessel is stopped, thereby completing formation of the deposited film.

In order to obtain the characteristics of the target deposited film, when a deposited film constituted by a plurality of layers is to be formed on the substrate, the deposited film having a desired layer constitution can be obtained by repeating the operation described above.

Figure 4A:
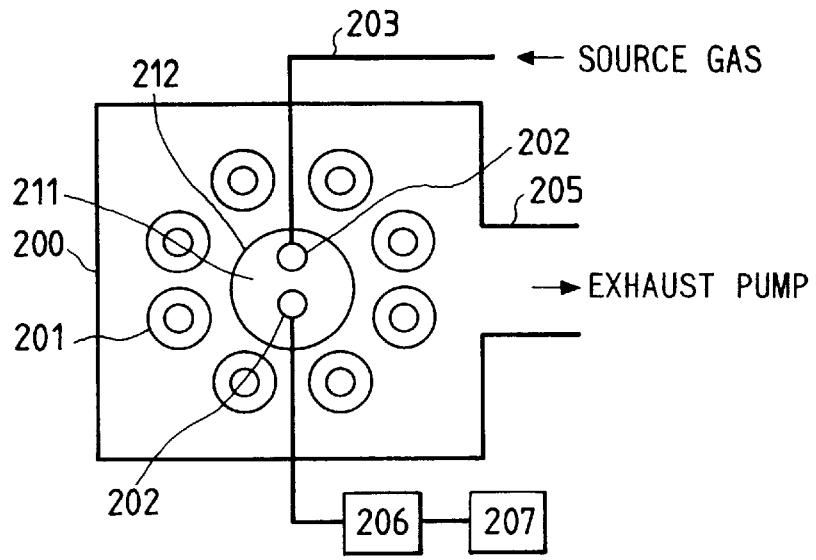
Figure 4B:
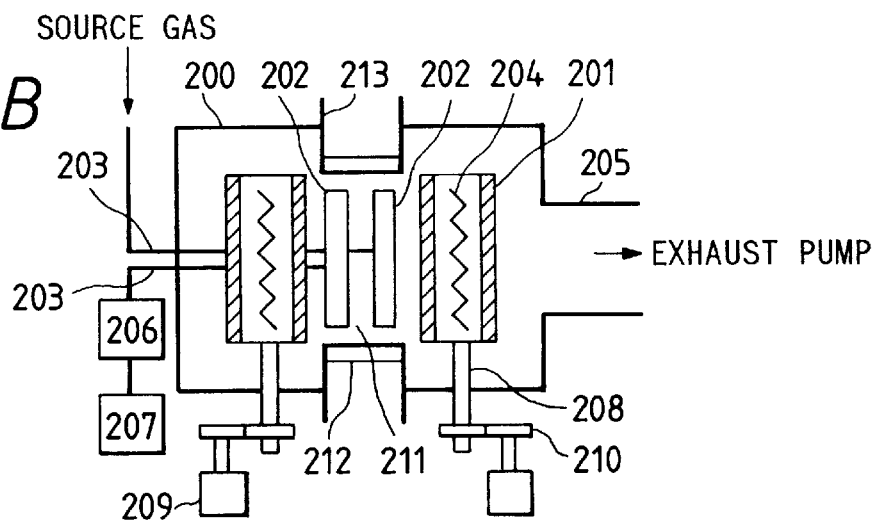

FIGS. 4A and 4B illustrate one preferred example of a deposited film forming apparatus according to the present invention when a high-frequency power and a microwave power are supplied into an internal chamber 211. As shown in FIGS. 4A and 4B, a microwave supply window 212, a wave guide 213, a microwave power supply (not shown), an isolator (not shown), and the like are connected to each other, so that a microwave can be also vertically supplied to the internal chamber 211.

Formation of a deposited film using the apparatus in which a high-frequency power and a microwave power are supplied can be performed in, for example, the following manner.

The substrates 201 which are degreased and cleaned in advance are arranged in the reaction vessel 200, and the reaction vessel 200 is evacuated by an exhausting apparatus (e.g., a vacuum pump) (not shown). The temperature of the substrates 201 is controlled by the heater 204 to a desired temperature of 20° C. to 500° C. while the substrates 201 are rotated.

When the substrates 201 reaches a desired temperature, a source gas from a source gas supply system (not shown) is supplied into the internal chamber 211 through a source gas supply pipe 203. At this time, attention must be paid to an extreme variation in pressure such as spouting of the gas. When the source gas is adjusted to a predetermined flow rate, an exhaust valve (not shown) is adjusted while watching a vacuum gauge (not shown) to obtain a desired internal pressure.

When the internal pressure is stable, a high-frequency power supply 207 is adjusted to a desired power to apply a high-frequency power to a high-frequency electrode 202 through a matching box 206. In addition, a microwave power supply (not shown) is adjusted to a desired power, and a microwave power passes through the isolator (not shown) and the wave guide 213 and is supplied into the discharge space 211 through the microwave supply window 212, thereby generating glow discharge. The source gas supplied into the reaction vessel 200 is decomposed by the discharge energy, thereby forming a predetermined deposited film on each of the substrates 201. After the deposited film is formed to have a desired thickness, supply of the high-frequency power and microwave power is stopped, and the flow of the source gas into the reaction vessel is stopped, thereby completing formation of the deposited film.

In order to obtain the characteristics of the target deposited film, when a deposited film constituted by a plurality of layers is to be formed on the substrate, the deposited film having a desired layer constitution can be obtained by repeating the operation described above.

Figure 5A:
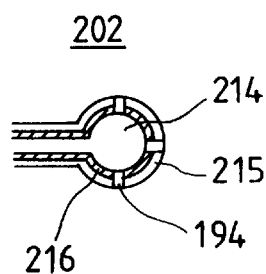
Figure 5B:
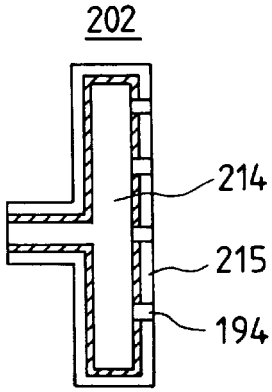

FIGS. 5A and 5B are sectional views showing a high-frequency electrode which is also used as a source gas supply portion in FIGS. 4A and 4B. In FIGS. 5A and 5B, reference numeral 214 denotes a path for gas supply; 215, insulating material; 216, a conductive material such as stainless steel constituting the path for gas supply; and 194, a gas discharge hole. More specifically, the conductive material member 216 has a hollow portion, and this hollow portion communicates with the gas discharge hole 194. This hole 194 is also formed in the insulating material 215 in the same manner as described above. For this reason, a source gas supplied through the hollow portion can be supplied into a vessel through the hole 194.

As a source gas used in the present invention, when amorphous silicon (a-Si) is to be formed, a silicon hydride (silanes) such as $SiH_4$ or $Si_2H_6$ which is set in a gas state or can be gasified is effectively used as a Si atom supply gas. In addition to the silicon hydride, a silicide containing fluorine atoms or a so-called silane derivative substituted with a fluorine atom may be used. More specifically, a material which is set in a gas state or can be gasified, e.g., a silicon fluoride such as $SiF_4$ or $Si_2F_6$ or a fluorine-substituted silicon hydride such as $SiH_3F$, $SiH_2F_2$, or $SiHF_3$ is effective as an Si atom supply gas in the present invention. Even if such a source gas for supplying Si atoms is diluted by a gas such as $H_2$, He, Ar, or Ne gas, the present invention is not influenced.

In addition, as an effective halogen supply gas for causing an amorphous silicon film to contain halogen atoms, for example, a halogen compound which is set in a gas state or can be gasified, e.g., a halogen gas, a halide, an interhalogen compound containing a halogen, a silane derivative substituted with a halogen is preferably available. As the effective halogen supply gas, the above silicon hydride compound which is set in a gas state or can be gasified, consists of a silicon atom and a halogen atom, and contains a halogen atom is available. As a halogen compound which can be preferably used, an interhalogen compound such as a fluorine gas ($F_2$), BrF, ClF, $ClF_3$, $BrF_3$, $BrF_5$, $IF_3$, or $IF_7$ can be available.

In the present invention, as an effective halogen supply gas, the halogen compound or a silicon compound containing a halogen atom is used. In addition to these compounds, a halide which is set in a gas state or can be gasified and contains a hydrogen atom as one of constituent elements, e.g., a hydrogen halide such as HF, HCl, HBr, or HI or a halogen-substituted silicon hydride such as $SiH_3F$, $SiH_2F_2$, $SiHF_3$, $SiH_2I_2$, $SiH_2Cl_2$, $SiHCl_3$, $SiH_2Br_2$, or $SiHBr_3$ is available as the effective source gas.

Since such a halogen compound containing a hydrogen atom supplies a halogen atom and also a hydrogen atom, the halogen compound is used as a preferable halogen atom supply gas.

In addition, as an effective hydrogen supply gas for causing the amorphous silicon film to contain a hydrogen atom, in addition to the above compounds, $H_2$, $D_2$ or a silicon hydride such as $SiH_4$, $Si_2H_6$, $Si_3H_8$, $Si_4H_{10}$ is available.

In addition to the above gas, if necessary, an element belonging to the group III of the periodic table (to be referred to as "group III element" hereinafter) or an element belonging to the group V of the periodic table (to be referred to as "group V element" hereinafter) can be used as an element for controlling conductivity, i.e., a so-called dopant.

As a group III element, more specifically, boron (B), aluminum (Al), gallium (Ga), indium (In), or thallium (Tl) is available. In particular, B, Al or Ga is preferably used. As a group V element, more specifically, phosphorus (P), arsenic (As), antimony (Sb), or bismuth (Bi) is available. In particular, P or As is preferably used.

For example, as a boron supply gas, a boron hydride such as $B_2H_6$ or $B_4H_{10}$ or a boron halide such as $BF_3$ or $BCl_3$ is available. As other group III element supply gases, $AlCl_3$, $GaCl_3$, $Ga(CH_3)_3$, $InCl_3$, $TlCl_3$, and the like are available.

As a phosphorus supply gas, a phosphorus hydride such as $PH_3$ or $P_2H_4$ or a phosphorus halide such as $PH_4I$, $PF_3$, $PCl_3$, $PBr_3$, $PI_3$ can be used. As other group V element supply gases, $ASH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, and the like are available.

If necessary, a gas obtained by diluting such an element supply gas for controlling conductivity by $H_2$ and/or He may be used.

In addition to the above gases, an atom belonging to the group III of the periodic table or an atom belonging to the group V of the periodic table may be used as a so-called dopant. For example, when a boron (B) atom is used, a boron hydride such as $B_2H_6$ or $B_4H_{10}$, a boron halide such as $BF_3$ or $BCL_3$, or the like is available. When a phosphorus atom is used, a phosphorus hydride such as $PH_3$ or $P_2H_4$ or a phosphorus halide such as $PH_4I$, $PF_3$, $PCl_3$, $PBr_3$, or $PI_3$ can be used.

When amorphous silicon carbide (a-SiC) is to be formed as a non-monocrystalline material containing a silicon atom, in addition to the above source gases, as a carbon atom supply gas, a gas constituted by C and H atoms, e.g., a saturated hydrocarbon having a carbon number of 1 to 5, a hydrocarbon of ethylene series having a carbon number of 2 to 4, a hydrocarbon of acetylene series having a carbon number of 2 to 3, or the like can be used. More specifically, methane ($CH_4$), ethane ($C_2H_6$), or the like is available as the saturated hydrocarbon; ethylene ($C_2H_4$), propylene ($C_3H_6$), or the like is available as the hydrocarbon of ethylene series; and acetylene ($C_2H_2$), methylacetylene ($C_3H_4$), or the like is available as the hydrocarbon of acetylene series.

For example, when amorphous silicon oxide (a-SiO) is to be formed, in addition to the above source gases, as an oxygen atom supply gas, oxygen ($O_2$), ozone ($O_3$), nitrogen monoxide (NO), nitrogen dioxide ($NO_2$), nitrogen dioxide ($N_2O$), dinitrogen trioxide ($N_2O_3$), dinitrogen tetroxide ($N_2O_4$), dinitrogen pentoxide ($N_2O_5$), nitrogen trioxide ($NO_3$), or a lower siloxane such as disiloxane ($H_3SiOSiH_3$)

or trisiloxane ($H_3SiOSiH_2OSiH_3$) constituted by a silicon atom (Si), an oxygen atom (O), and a hydrogen atom (H) is available.

In the present invention, for example, when amorphous silicon nitride (a-SiN) is to be used, in addition to the source gases, as a nitrogen atom supply gas, a nitrogen compound which is set in a gas state or can be gasified and is constituted by nitrogen, nitrides, and azides, e.g., nitrogen ($N_2$), ammonia ($NH_3$), hydrazine ($H_2NNH_2$), hydrogen azide ($HN_3$), ammonium azide ($NH_4N_3$) and the like can be available. A nitrogen halide compound such as nitrogen trifluoride ($F_3N$), nitrogen tetrafluoride ($F_4N_2$), or the like is also available because these compounds can supply not only a nitrogen atom but also a halogen atom.

The above-mentioned $NO$, $NO_2$, $N_2O$, $N_2O_3$, $N_2O_4$, $N_2O_5$, or $NO_3$ available as a gas which can be used to form the above a-SiO is also used as a nitrogen atom supply gas.

As described above, a non-monocrystalline material containing silicon, especially, an amorphous material (amorphous silicon based material) containing silicon can contain at least two kinds of atoms selected from the group consisting of a carbon atom, a nitrogen atom, and an oxygen atom.

Preferable layer constitution obtained when a light-receiving member for electrophotography is manufactured by the present invention are shown in FIGS. 6A to 6E.

FIGS. 6A to 6E are views for explaining the layer constitution, respectively.

Figure 6A:
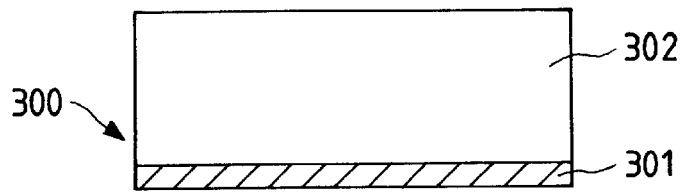
FIGS. 6A to 6E are sectional views illustrating one preferable example of a light-receiving member which can be formed by the apparatus of the present invention.

In a light-receiving member 300 for electrophotography shown in FIG. 6A, a photoconductive layer 302 having photoconductivity and consisting of a-Si containing hydrogen and/or a halogen (to be referred to as "a-Si(H, X)" hereinafter) is formed on a substrate 301.

Figure 6B:
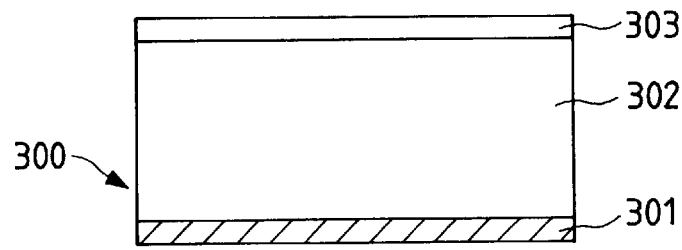

The light-receiving member 300 for electrophotography shown in FIG. 6B is constituted by the photoconductive layer 302 having photoconductivity and consisting of a-Si (H, X) is formed on a substrate 301, and an amorphous silicon based surface layer 303 formed on the photoconductive layer 302.

Figure 6C:
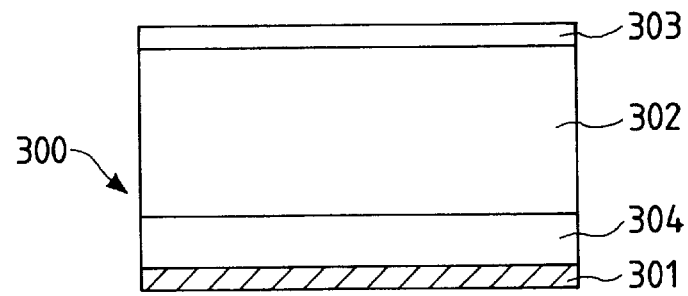

In the light-receiving member 300 for electrophotography shown in FIG. 6C, an amorphous silicon based charge injection blocking layer 304, the photoconductive layer 302 having photoconductivity and consisting of a-Si(H, X), and an amorphous silicon based surface layer 303 formed on the photoconductive layer 302 are sequentially formed in this order.

Figure 6D:
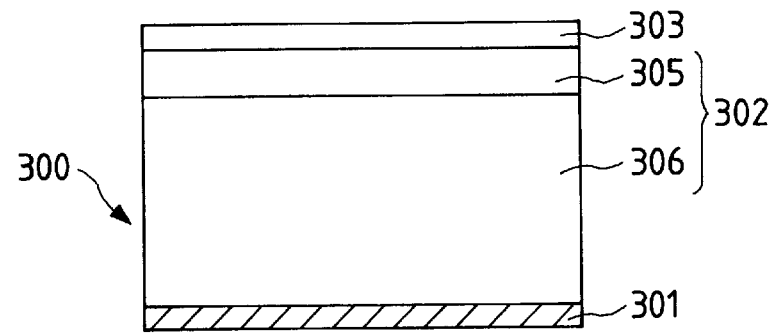

In the light-receiving member 300 for electrophotography shown in FIG. 6D, the photoconductive layer 302 is formed on the substrate 301, the photoconductive layer 302 has a charge generation layer 305 consisting of a-Si(H, X) and a charge transfer layer 306, and the amorphous silicon based surface layer 303 is formed on the photoconductive layer 302.

Figure 6E:
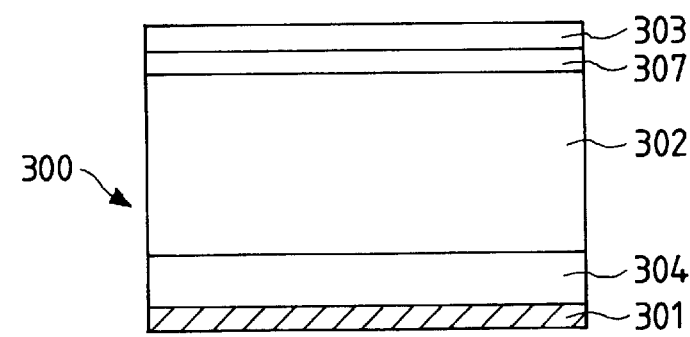

In the light-receiving member 300 for electrophotography shown in FIG. 6E has an arrangement in which the amorphous silicon based charge injection blocking layer 304, the photoconductive layer 302 having conductivity and consisting of a-Si(H, X), an amorphous silicon based upper blocking layer 307, and the amorphous silicon based surface layer 303 are sequentially formed on the substrate 301 in this order.

[Substrate]

As a substrate for a light-receiving member for electrophotography, either of a conductive substrate and an electrically insulating substrate may be used. As the conductive substrate, a metal such as Al, Cr, Mo, Au, In, Nb, Te, V, Ti, Pt, Pd, or Fe or an alloy thereof such as stainless steel is available. In addition, a substrate of a synthetic resin film or sheet such as polyester, polystyrene, polycarbonate, cellulose acetate, polypropylene, polyvinyl chloride, polyethylene, or polyamide or an electrically insulating substrate such as glass or ceramics a surface of which is subjected to conductivity treatment at least at the side of a light-receiving layer can also be used. Also, the surface opposing the surface on which the light-receiving layer is to be formed is desirably subjected to conductivity treatment.

The substrate 301 preferably has a cylindrical shape, and its thickness is properly determined to form the desired light-receiving member 300 for electrophotography. When the light-receiving member 300 for electrophotography requires flexibility, the thickness of the substrate 301 can be decreased as much as possible if the substrate 301 can perform its function. However, the thickness of the substrate 301 is generally 10 $\mu$m or more from a viewpoint of mechanical strength or the like on manufacturing and handling.

The surface of the substrate 301 may be made smooth or uneven. For example, when image recording using coherent light such as a laser beam is to be performed by a light receiving member for electrophotography, in order to eliminate an image failure caused by an interference pattern appearing on a visible image, an uneven surface manufactured by a known method described in JP-A-60-168156, JP-A-60-178457, or JP-A-60-225854 can be used as the surface of the substrate.

[Photoconductive Layer]

The photoconductive layer 302 is formed on the substrate 301 such that numeral conditions of film formation parameters are properly set to obtain desired characteristics. In order to form the photoconductive layer 302, as described above, basically, the silicon supply gas, a hydrogen supply gas, or/and a halogen supply gas are supplied into a deposition chamber in a desired gas state, and glow discharge is generated in the deposition chamber, thereby forming an a-Si(H, X) layer on the predetermined substrate 301 arranged at a predetermined position in advance.

The a-Si film in the photoconductive layer 302 contains a hydrogen atom or/and a halogen atom. For this reason, the dangling bond of an Si atom is compensated for to improve layer quality, in particular, improve photoconductivity and charge holding characteristics. The contents of the hydrogen atom or the halogen atom contained in the a-Si film or the total content of the hydrogen and halogen atoms is preferably 1 atomic % to 40 atomic %, more preferably, 5 atomic % to 35 atomic %.

In order to control the contents of the hydrogen atom or/and halogen atom contained in the photoconductive layer 302, for example, the temperature of the substrate 301, an amount of a source material supplied into the deposition chamber which is used to cause the photoconductive layer 302 to contain a hydrogen atom or/and a halogen atom, a discharge power, and the like may be controlled.

The photoconductive layer 302 preferably contains an element for controlling its conductivity as needed. The photoconductive layer 302 may contain the element for controlling conductivity such that the element is uniformly and entirely distributed in the photoconductive layer 302, or the element is partially ununiformly distributed in the direction of the layer thickness.

As the element for controlling conductivity, the above group III element or group V element can be used.

The content of the element, contained in the photoconductive layer 302, for controlling conductivity is preferably $1 \times 10^{-2}$ atomic ppm to $1 \times 10^2$ atomic ppm, more preferably, $5 \times 10^{-2}$ atomic ppm to 50 atomic ppm, and optimally, 0.1 atomic ppm to 10 atomic ppm.

In order to structurally supply the element for controlling conductivity, e.g., a group III element or a group V element, during the layer formation, the above group III element supply gas or group V element supply gas may be supplied into the deposition chamber together with other gases for forming the photoconductive layer 302.

In addition, it is effective that the photoconductive layer 302 contains at least one element selected from the group consisting of a carbon atom, an oxygen atom, and a nitrogen atom. The content of at least one element selected from the group consisting of a carbon atom, an oxygen atom, and a nitrogen atom is preferably $1 \times 10^{-5}$ atomic ppm to 30 atomic ppm, more preferably, $1 \times 10^{-4}$ atomic ppm to 20 atomic ppm, and optimally, $1 \times 10^{-3}$ atomic ppm to 10 atomic ppm. At least one element selected from the group consisting of a carbon atom, an oxygen atom, and a nitrogen atom may be uniformly and entirely contained in the photoconductive layer 302, or the photoconductive layer 302 may partially have an ununiform distribution to have the content changed in the direction of the layer thickness of the photoconductive layer 302.

In order to structurally supply at least one element selected from the group consisting of a carbon atom, an oxygen atom, and a nitrogen atom, during the layer formation, the above carbon, oxygen, or nitrogen atom supply gas may be supplied into the deposition chamber together with other gases for forming the photoconductive layer 302.

The thickness of the photoconductive layer 302 is properly and desirably determined such that desired electrophotographic characteristics and economic effects are obtained. The thickness is preferably 5 μm to 80 μm, more preferably, 10 μm to 60 μm, and optimally, 15 μm to 45 μm.

In order to form the photoconductive layer 302 having characteristics capable of achieving the object, the temperature of the substrate 301 and the gas pressure in the deposition chamber must be properly and desirably set.

The temperature (Ts) of the substrate 301 falls within an optimum range properly selected on the basis of the layer design. In general, the temperature preferably falls within the range of 50° C. to 400° C., more preferably, the range of 150° C. to 350° C., and optimally, the range of 200° C. to 300° C.

Like the substrate temperature, a gas pressure in the deposition chamber falls within an optimum range properly selected on the basis of the layer design. In general, the pressure preferably falls within the range of 0.01 Pa to 1,000 Pa, more preferably, the range of 0.05 Pa to 500 Pa, and optimally, the range of 0.1 Pa to 100 Pa.

Although the above ranges are used as the desirable numeral ranges of the substrate temperature and gas pressure to form the photoconductive layer 302, a mixture ratio of a silicon atom supply gas and other atom supply gases, a discharge power, and the like must be properly set. In general, these conditions cannot be independently determined. For this reason, the optimum values are desirably determined on the basis of the mutual and organic relation to form a light-receiving member for electrophotography having desired characteristics.

[Surface Layer]

The amorphous silicon based surface layer 303 is preferably formed on the photoconductive layer 302 formed on the substrate 301 as described above. The surface layer 303 is formed to mainly improve humidity resistance, continuous repetitive use characteristics, electric voltage resistance, use environment characteristics, and durability.

Although the surface layer 303 can consist of an arbitrary amorphous silicon based material, for example, a material such as amorphous silicon (to be referred to as "a-SiC (H, X)" hereinafter) containing a hydrogen atom (H) and/or a halogen atom (X) and containing a carbon atom; amorphous silicon (to be referred to as "a-SiO (H, X)" hereinafter) containing a hydrogen atom (H) and/or a halogen atom (X) and containing an oxygen atom; amorphous silicon (to be referred to as "a-SiN (H, X)" hereinafter) containing hydrogen atom (H) and/or a halogen atom (X) and containing a nitrogen atom; and amorphous silicon (to be referred to as "a-Si(C, O, N) (H, X)" hereinafter) containing a hydrogen atom (H) and/or a halogen atom (X) and containing at least one of a carbon atom, an oxygen atom, and a nitrogen atom is preferably used.

The surface layer 303 is formed by a vacuum deposited film forming method such that numeral conditions of film formation parameters are properly set to obtain desired characteristics.

For example, in order to form the surface layer 303 consisting of a-SiC (H, X), as described above, basically, the silicon atom supply gas, a carbon atom supply gas, a hydrogen atom supply gas, or/and a halogen atom supply gas are supplied in a desired gas state into a deposition chamber in which a pressure can be reduced, and glow discharge is generated in the deposition chamber. In this manner, a layer consisting of a-SiC (H, X) is preferably formed on the predetermined substrate 301, arranged at a predetermined position in advance, on which the photoconductive layer 302 is formed.

When the surface layer 303 contains a-Si(C, O, N) (H, X) as a main component, the total content of a carbon atom, an oxygen atom, or a nitrogen atom preferably falls within the range of 1 atomic % to 90 atomic %, more preferably, 5 atomic % to 70 atomic %, and optimally, 10 atomic % to 50 atomic %.

The surface layer 303 necessarily contains a hydrogen atom or/and a halogen atom. This is important to compensate for the dangling bond of a silicon atom, and a carbon atom, an oxygen atom, or a nitrogen atom and improve layer quality, in particular, photoconductive characteristics and charge holding characteristics. The contents of the hydrogen atom and/or the halogen atom is generally 1 atomic % to 70 atomic %, preferably, 10 atomic % to 60 atomic %, and optimally, 20 atomic % to 50 atomic %.

In order to control the contents of the hydrogen atom or/and halogen atom contained in the surface layer 303, for example, the temperature of the substrate 301, an amount of a source material for using to cause the surface layer 303 to contain a hydrogen atom or/and a halogen atom, supplied into the deposition chamber, a discharge power, and the like may be controlled.

The carbon atom, oxygen atom, or nitrogen atom may be uniformly and entirely contained in the surface layer 303, or the surface layer 303 may partially have an ununiform distribution to have the content changed in the direction of the layer thickness of the surface layer 303.

In addition, the surface layer 303 may further contain an element for controlling its conductivity as needed. The surface layer 303 may contain the element for controlling conductivity such that the element may be uniformly and entirely distributed in the surface layer 303, or the element may be partially ununiformly distributed in the direction of the layer thickness.

As the element for controlling conductivity, the above group III element or group V element can be used.

The content of the element, contained in the surface layer 303, for controlling conductivity is preferably $1 \times 10^{-3}$ atomic ppm to $1 \times 10^3$ atomic ppm, more preferably, $5 \times 10^{-3}$ atomic ppm to $5 \times 10^2$ atomic ppm, and optimally, $1 \times 10^{-2}$ atomic ppm to $1 \times 10^2$ atomic ppm. In order to structurally supply the element for controlling conductivity, e.g., a group III element or a group V element, during the layer formation, the above group III element supply gas or group V element supply gas may be supplied into the deposition chamber together with other gases for forming the surface layer 303.

The thickness of the surface layer 303 is generally 0.01 $\mu$m to 3 $\mu$m, more preferably, 0.05 $\mu$m to 2 $\mu$m, and optimally, 0.1 $\mu$m to 1 $\mu$m. When the thickness is smaller than 0.01 $\mu$m, the surface layer 303 is lost because of abrasion or the like during use of the light-receiving member for electrophotography; when the thickness exceeds 3 $\mu$m, degradation of electrophotographic characteristics such as an increase in residual voltage may occur.

The surface layer 303 is carefully formed to obtain demanded characteristics as desired. That is, the structure of a material consisting of Si, C, and N or O, H and/or X varies from a crystalline state to an amorphous state, its electric property varies from conductive property to semiconductive property and insulating property, and also varies from photoconductive property to non-photoconductive property depending on formation conditions. For the reason, according to the present invention, in order to form a compound having desired characteristics according to an object, the formation conditions are strictly selected as desired.

For example, when the surface layer 303 is formed to mainly improve voltage resistance, the surface layer 303 is formed as a non-monocrystalline material having an electrically insulating behavior which is conspicuous in its use environment.

When the surface layer 303 is formed to mainly improve continuous repetitive use characteristics or use environment characteristics, the degree of electrically insulating characteristics is moderated to some extent, and the surface layer 303 is formed as a non-monocrystalline material having a sensitivity to some extent with respect to irradiated light.

In order to the surface layer 303 having characteristics capable of achieving the object, the temperature of the substrate 301 and the gas pressure in the deposition chamber must be properly and desirably set.

The temperature (Ts) of the substrate 301 falls within an optimum range properly selected on the basis of the layer design. In general, the temperature preferably falls within the range of 50° C. to 400° C., more preferably, the range of 150° C. to 350° C., and optimally, the range of 250° C. to 300° C.

Like the substrate temperature, a gas pressure in the deposition chamber falls within an optimum range properly selected on the basis of the layer design. In general, the pressure preferably falls within the range of 0.01 Pa to 1,000 Pa, more preferably, the range of 0.05 Pa to 500 Pa, and optimally, the range of 0.1 Pa to 100 Pa.

The above ranges are used as the desirable numeral ranges of the substrate temperature and gas pressure to form the surface layer 303. In general, these conditions cannot be independently determined. For this reason, the optimum values are desirably determined on the basis of the mutual and organic relation to form a light-receiving member for electrophotography having desired characteristics.

In addition, a region in which the content of a carbon atom, an oxygen atom, or a nitrogen atom continuously decreases toward the photoconductive layer 302 may be formed between the surface layer 303 and the photoconductive layer 302. In this manner, the adhesion between the surface layer and the photoconductive layer 302 can be improved, and the influence of interference caused by light reflection on the interface can be decreased. At the same time, carriers can be prevented from being trapped on the interface, so that improvement in characteristics of the light-receiving member for electrophotography can be achieved.

[Charge Injection Blocking Layer and Upper Blocking Layer]

If necessary, the charge injection blocking layer 304 for preventing injection of charges from a conductive substrate side may be formed between the conductive substrate and the photoconductive layer 302. More specifically, when the surface of the light-receiving member for electrophotography is subjected to a charging treatment of a predetermined polarity, the charge injection blocking layer 304 functions to prevent charges from being injected from the substrate side to the photoconductive layer 302 side. When the surface is subjected to a charging treatment of an opposite polarity, the charge injection blocking layer 304 does not perform the above function. That is, the charge injection blocking layer 304 has so-called polarity dependence. In order to give such a function to the charge injection blocking layer 304, the charge injection blocking layer 304 contains an element for controlling conductivity which is relatively larger in content than that of photoconductive layer 302.

If necessary, the upper blocking layer 307 for preventing charges from being injected from the surface layer side may also be formed between the photoconductive layer 302 and the surface layer 303. More specifically, when the surface of the light-receiving member for electrophotography is subjected to a charging treatment of a predetermined polarity, the upper blocking layer 307 functions to prevent charges from being injected from the surface layer 303 side to the photoconductive layer 302 side. When the surface is subjected to a charging treatment of an opposite polarity, the upper blocking layer 307 does not perform the above function. That is, the upper blocking layer 307 has so-called polarity dependence. In order to give such a function to the upper blocking layer 307, like the charge injection blocking layer 304, the upper blocking layer 307 contains an element for controlling conductivity which is relatively larger in content than that of photoconductive layer 302.

The element for controlling conductivity contained in each layer may be uniformly and entirely distributed in the corresponding layer, or although the element is uniformly contained in the layer in the direction of the thickness, the element may be partially ununiformly contained in the layer. When a distribution concentration is ununiform, the layer contains the element such that the high-concentration portion is preferably located on the substrate side.

However, in any case, in order to make characteristics in an in-plane direction uniform, it is necessary that the element is uniformly and entirely contained in the layer in an in-plane direction parallel to the surface of the substrate.

As the element, contained in the charge injection blocking layer 304 and/or the upper blocking layer 307, for controlling conductivity, the above group III element or group V element can be used.

Although the content of the element, contained in the charge injection blocking layer 304 and/or the upper blocking layer 307, for controlling conductivity is properly determined as desired, the content is preferably 10 atomic ppm to $1 \times 10^4$ atomic ppm, more preferably, 50 atomic ppm to $5 \times 10^3$ atomic ppm, and optimally, $1 \times 10^2$ atomic ppm to $3 \times 10^3$ atomic ppm.

When at least one kind of a carbon atom, a nitrogen atom, and an oxygen atom is contained in the charge injection blocking layer 304 and/or the upper blocking layer 307, the adhesion between the charge injection blocking layer 304 and/or the upper blocking layer 307 and another layer or substrate formed to be in direct contact with the charge injection blocking layer 304 and/or the upper blocking layer 307 can be improved further.

The carbon atom, nitrogen atom, or oxygen atom contained in each layer may be uniformly and entirely distributed in the corresponding layer, or although the atom is uniformly contained in the layer in the direction of the thickness, the atom may be partially ununiformly contained in the layer. However, in any case, in order to make characteristics in an in-plane direction uniform, it is necessary that the atom is uniformly and entirely contained in the layer in an in-plane direction parallel to the surface of the substrate.

The total content of the carbon atom, nitrogen atom, or oxygen atom contained in the entire layer region of the charge injection blocking layer 304 and the upper blocking layer 307 is properly determined to obtain desired film characteristics. The content of an atom (when one kind of these atoms is used), or the total content of atoms (when two or more kinds of these atoms are used) is preferably $1 \times 10^{-3}$ atomic ppm to 50 atomic ppm, more preferably, $5 \times 10^{-3}$ atomic ppm to 30 atomic ppm, and optimally, $1 \times 10^{-2}$ atomic ppm to 10 atomic ppm.

The hydrogen atom and/or halogen atom contained in the charge injection blocking layer 304 and/or the upper blocking layer 307 compensate for a dangling bond present in the corresponding layer to improve the quality of the corresponding layer. The content of the hydrogen atom, the content of the halogen atom, or the total content of the hydrogen and halogen atoms is preferably 1 atomic % to 50 atomic %, more preferably, 5 atomic % to 40 atomic %, and optimally, 10 atomic % to 30 atomic %.

In order to obtain desired electrophotographic characteristics, an economic effect, and the like, the thickness of the charge injection blocking layer 304 is preferably 0.1 μm to 10 μm, more preferably, 0.3 μm to 5 μm, and optimally, 0.5 μm to 3 μm.

In order to obtain desired electrophotographic characteristics, an economic effect, and the like, the thickness of the upper blocking layer 307 is preferably 0.01 μm to 3 μm, more preferably, 0.05 μm to 2 μm, and optimally, 0.1 μm to 1 μm.

In order to form the charge injection blocking layer 304 and/or the upper blocking layer 307, the same vacuum deposition method as the method of forming the photoconductive layer 302 is employed. As in the photoconductive layer 302, a mixture ratio of a silicon atom supply gas and other atom supply gases, a gas pressure in the deposition chamber, a discharge power, and the temperature of the substrate 301 must be properly set.

The gas pressure in the deposition chamber falls within an optimum range which is properly selected. In general, the pressure preferably falls within the range of 0.01 Pa to 1,000 Pa, preferably, the range of 0.05 Pa to 500 Pa, and optimally, the range of 0.1 Pa to 100 Pa.

In general, layer formation factors such as the mixture ratio of diluted gases for forming the charge injection blocking layer 304 and/or the upper blocking layer 307, a gas pressure, a discharge power, and a substrate temperature cannot be independently determined. For this reason, the optimum values of the layer formation factors are desirably determined on the basis of the mutual and organic relation to form the charge injection blocking layer 304 and the upper blocking layer 307 which have desired characteristics.

In order to further improve the adhesion between the substrate 301 and the photoconductive layer 302 or the charge injection blocking layer 304, an adhesive layer consisting of an amorphous material or the like which contains e.g., $Si_3N_4$, $SiO_2$, SiO, or a silicon atom as a base member and contains a hydrogen atom and/or a halogen atom and a carbon atom, an oxygen atom, or a nitrogen atom may be formed. Furthermore, a light-absorbing layer for preventing generation of an interference pattern caused by light reflected from the substrate may be formed.

The concentration of the element for controlling conductivity in the photoconductive layer can be increased on the substrate side or the surface side to give the above functions to the charge injection blocking layer or the upper blocking layer.

The present invention will be described in further detail below referring to examples.

EXAMPLE 1

In the deposited film forming apparatus shown in FIGS. 2A and 2B, by using the high-frequency power supply portion 102 obtained by plasma-spraying a ceramics 113 containing $Al_2O_3$ as a main component on the surface of a stainless base member 112 by a thickness of 100 μm and by using the high-frequency power supply 107 having an oscillation frequency of 105 MHz, an amorphous Si film was formed ten times on an aluminum cylindrical substrate 101 under the film formation conditions shown in Table 1, thereby forming a light-receiving member for electrophotography having a layer constitution shown in FIG. 6C.

Comparative Example 1

In this Example, film formation was carried out ten times in the same manner as in Example 1 except that the high-frequency electrode 102 formed by stainless steel without plasma-spraying the ceramics 113 containing $Al_2O_3$ as a main component on the surface of the base member was used, thereby forming a light-receiving member for electrophotography.

TABLE 1

| Layer Constitution | Charge Injection Blocking Layer | Photo-conductive Layer | Surface Layer |
|---|---|---|---|
| Source Gas Flow Rate | | | |
| $SiH_4$ (sccm) | 500 | 500 | 50 |
| $H_2$ (sccm) | 1000 | 1000 | |
| $B_2H_6$ (ppm) (based on $SiH_4$) | 2000 | 2 | |
| $CH_4$ (sccm) | 400 | | 500 |
| Substrate Temperature (° C.) | 300 | 300 | 300 |
| Internal Pressure (Pa) | 2 | 2 | 2 |
| High-frequency Power (W) | 1000 | 1000 | 500 |
| Layer Thickness (μm) | 3 | 30 | 0.5 |

The light-receiving members for electrophotography formed in Example 1 and Comparative Example 1 were evaluated by the following methods.
Globular Projection Density:
The surface of each light-receiving member for electrophotography was observed with an optical microscope. The number of globular projections each having a diameter of 15 $\mu$m or more per 10 cm$^2$ was examined.

Number of White Dots

Each light-receiving member for electrophotography was set in an electrophotographic apparatus (obtained by modifying NP6060 manufactured by CANON INC. for an experiment). A full-black chart manufactured by CANON INC. (parts number: FY9-9073) was placed on an original table and copied. The number of white dots each having a diameter of 0.2 mm or more in the same area of an obtained copy image was examined.

Image Density Reproducibility

Each light-receiving member for electrophotography was set in an electrophotographic apparatus (obtained by modifying NP6060 manufactured by CANON INC. for an experiment), and a test sheet NA-7 manufactured by CANON INC. (parts number: FY9-9060) was placed on an original table and copied. In an obtained copy image, an image density in a dot portion having a diameter of 0.05 to 0.2 mm was measured by an image densitometer (RD914 manufactured by MACBETH) to examine the reproducibility of the image density.

The above evaluations were performed to calculate the average value of the characteristics of each of the light-receiving members for electrophotography formed in Example 1 and Comparative Example 1. As a result, the light-receiving member for electrophotography of Example 1 had a globular projection density 0.76 times, the number of white dots 0.66 times, and image density reproducibility 1.21 times those of the light-receiving member for electrophotography of Comparative Example 1, respectively. Therefore, it was found that a deposited film having a small number of structural defects and preferable film quality could be formed according to the present invention.

EXAMPLE 2

In the deposited film forming apparatus shown in FIGS. 2A and 2B, film formation was carried out ten times under the same conditions as in Example 1 except that the oscillation frequency of the high-frequency power supply 107 was 20 MHz, 50 MHz, 200 MHz, 300 MHz, and 450 MHz and film formation conditions were ones shown in Table 2, thereby forming a light-receiving member for electrophotography.

TABLE 2

| Layer Constitution | Charge Injection Blocking Layer | Photo-conductive Layer | Surface Layer |
|---|---|---|---|
| Source Gas Flow Rate | | | |
| SiH$_4$ (sccm) | 300 | 300 | 30 |
| H$_2$ (sccm) | 1000 | 1500 | |
| B$_2$H$_6$ (ppm) (based on SiH$_4$) | 3000 | 3 | |
| NO (sccm) | 15 | | |
| CH$_4$ (sccm) | | | 600 |
| Substrate Temperature (° C.) | 250 | 250 | 250 |
| Internal Pressure (Pa) | 15 | 15 | 30 |
| High-frequency Power (W) | 500 | 500 | 400 |
| Layer Thickness ($\mu$m) | 3 | 25 | 0.5 |

Comparative Example 2-1

Figure 1B:
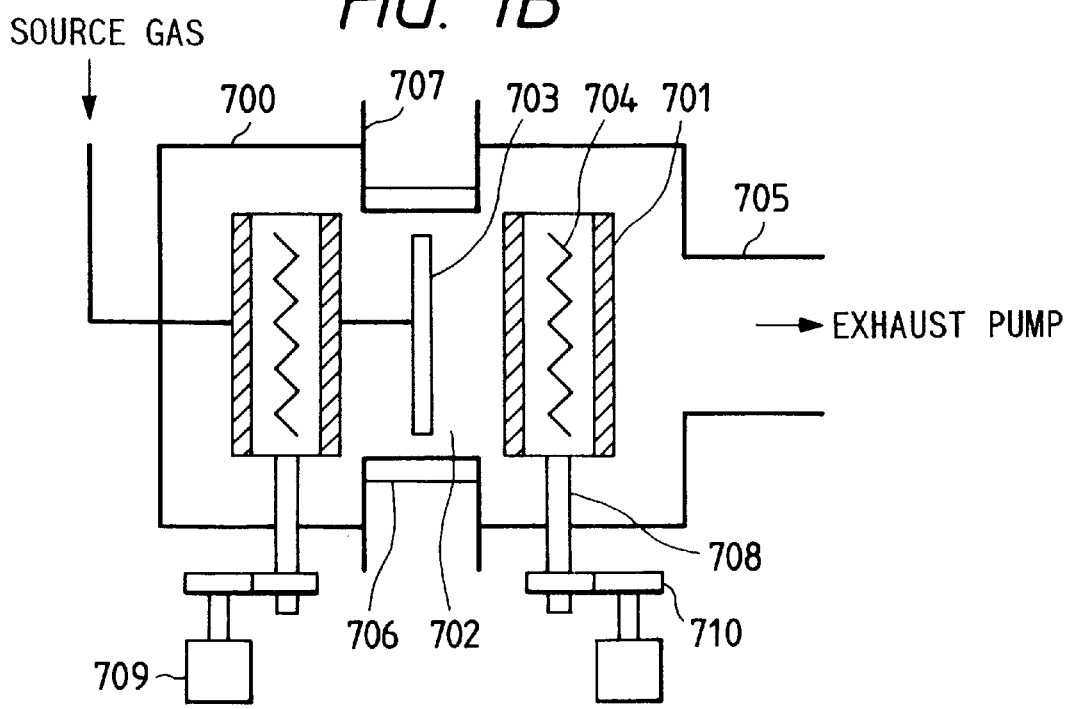
FIG. 1B is a longitudinal sectional view illustrating the apparatus as shown in FIG. 1A.

In the deposited film forming apparatus shown in FIGS. 1A and 1B, film formation was carried out ten times under the same conditions as in Comparative Example 1 except that the oscillation frequency of the high-frequency power supply 107 was 20 MHz, 50 MHz, 200 MHz, 300 MHz, and 450 MHz and the film formation conditions were ones shown in Table 2, thereby forming a light-receiving member for electrophotography.

Comparative Example 2-2

In the deposited film forming apparatus shown in FIGS. 1A and 1B, film formation was carried out ten times under the same conditions as in Example 2 except that the oscillation frequency of the high-frequency power supply 107 was 13.56 MHz, thereby forming a light-receiving member for electrophotography.

Comparative Example 2-3

In the deposited film forming apparatus shown in FIGS. 1A and 1B, film formation was carried out ten times under the same conditions as in Example 2 except Example 2-1 except that the oscillation frequency of the high-frequency power supply 107 was 13.56 MHz, thereby forming a light-receiving member for electrophotography.

The light-receiving members for electrophotography formed in Example 2 and Comparative Example 2-1 are evaluated with respect to a globular projection density, the number of white dots, and image density reproducibility in the same procedures as in Example 1. As a result, relative values with reference to the results in Comparative Example 2-1 obtained at identical oscillation frequencies are shown in Table 3. As is apparent from Table 3, at any oscillation frequency, the light-receiving member for electrophotography of Example 2 of the present invention has a low globular projection density, a small number of white dots, and excellent image density reproducibility.

TABLE 3

| Oscillation Frequency (MHz) | 20 | 50 | 200 | 300 | 450 |
|---|---|---|---|---|---|
| Globular Projection Density | 0.85 | 0.78 | 0.69 | 0.73 | 0.76 |
| Number of White Dots | 0.77 | 0.73 | 0.68 | 0.62 | 0.71 |
| Image Density Reproducibility | 1.13 | 1.16 | 1.25 | 1.27 | 1.22 |

Note: Table 3 shows relative values of the results obtained in Example 2 when the results obtained in Comparative Example 21 are regarded as 1.0 at identical frequencies.

The light-receiving members for electrophotography of Comparative Examples 2-2 and 2-3 are not different from that of Comparative Example 2-1 in any characteristics.

As is apparent from the above result, it was found that a deposited film having a small number of structural defects and preferable film quality could be obtained according to the present invention.

EXAMPLE 3

A light-receiving member for electrophotography was formed under the same conditions as in Example 1 except the high-frequency power supply portion 102 in which a ceramics material containing a mixture of Al$_2$O$_3$ and TiO$_2$ at a ratio of 3:2 as a main component was sprayed on the surface of a stainless base member by a thickness of 200 $\mu$m was used.

The light-receiving member for electrophotography formed in Example 3 was evaluated in the same procedures as in Example 1 with respect to a globular projection density, the number of white dots, and image density reproducibility. The obtained results are shown in Table 5. As is apparent from Table 5, it was found that a deposited film having a small number of structural defects and preferable film quality could be obtained according to the present invention.

EXAMPLE 4

Figure 7A:
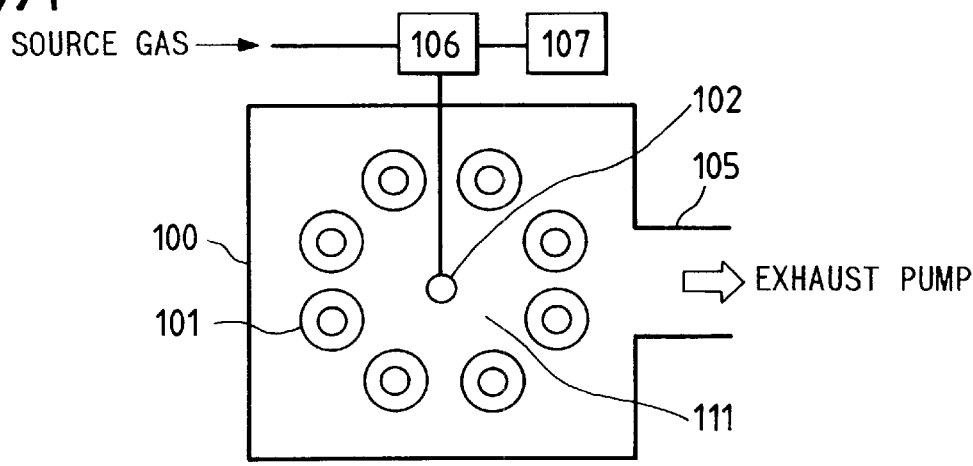
Figure 7B:
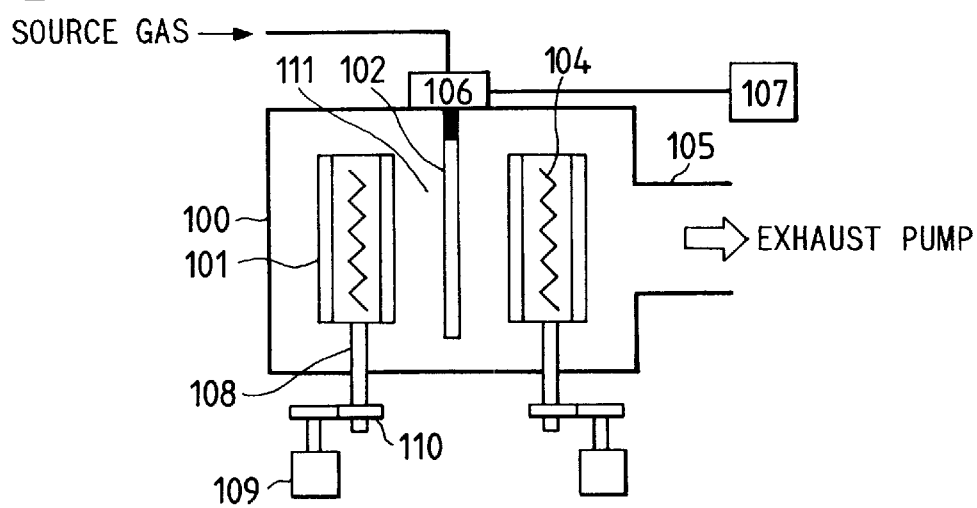
Figure 8A:
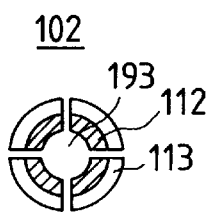
Figure 8B:
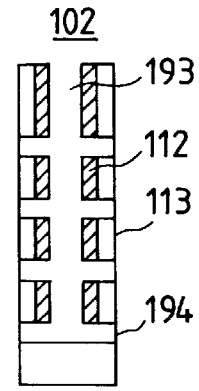

In the deposited film forming apparatus shown in FIGS. 7A and 7B, a light-receiving member for electrophotography was formed under the same conditions as in Example 1 except that a high-frequency power supply portion 102 was also used as a source gas supply portion in which a ceramics material 113 containing $Al_2O_3$ as a main component was plasma-sprayed on the surface of a stainless base member 112 to have a thickness of 50 μm (see FIGS. 8A and 8B). In FIGS. 8A and 8B, reference numeral 193 denotes a gas introduction path; 194, a gas discharge hole.

The light-receiving member for electrophotography formed in Example 4 was evaluated with respect to a globular projection density, the number of white dots, and an image density reproducibility in the same procedures as in Example 1. The obtained results are shown in Table 5. As is apparent from Table 5, it was found that a deposited film having a small number of structural defects and preferable film quality could be obtained according to the present invention.

EXAMPLE 5

In the deposited film forming apparatus shown in FIGS. 2A and 2B, a light-receiving member for electrophotography was formed under the same conditions as in Example 1 except that a high-frequency power supply portion 402 (shown in FIGS. 9A and 9B) in which a ceramics material 413 containing $TiO_2$ as a main component was plasma-sprayed by a thickness of 100 μm on the surface of a stainless base member 412 having a sheath heater 414 incorporated therein was used and the high-frequency power supply portion was heated to 250° C.

The light-receiving member for electrophotography formed in Example 5 was evaluated with respect to a globular projection density, the number of white dots, and an image density reproducibility in the same procedures as those of Example 1. The obtained results are shown in Table 5. As is apparent from Table 5, it was found that a deposited film having a small number of structural defects and preferable film quality could be obtained according to the present invention.

EXAMPLE 6

Figure 9A:
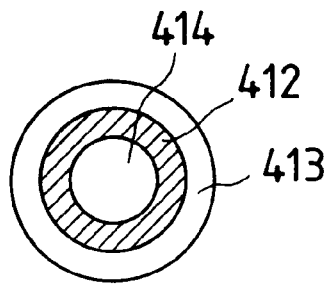
Figure 9B:
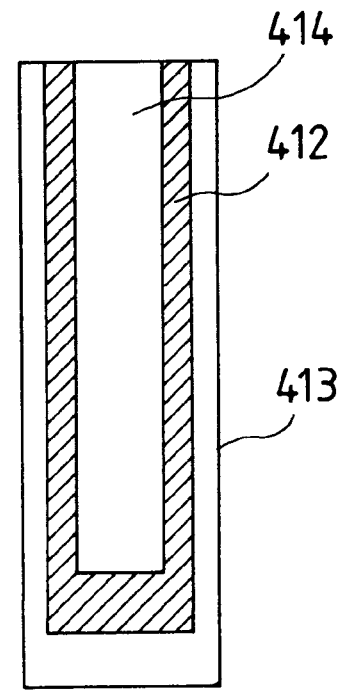

In the deposited film forming apparatus shown in FIGS. 2A and 2B, a light receiving member for electrophotography was formed under the same conditions as in Example 1 except that a high-frequency power supply portion 402 in which a ceramics material 413 containing $Al_2O_3$ as a main component was plasma-sprayed by a thickness of 50 μm on the surface of a stainless base member 412 having a water-cooled pipe 414 incorporated therein was used in place of the sheath heater 414 in FIGS. 9A and 9B, a cooling water having a temperature of 20° C. was circulated in the water-cooled pipe of the high-frequency power supply portion, and the oscillation frequency of the high-frequency power supply 107 was 200 MHz.

The light-receiving member for electrophotography formed in Example 6 was evaluated with respect to a globular projection density, the number of white dots, and an image density reproducibility in the same procedures as in Example 1. The obtained results are shown in Table 5. As is apparent from Table 5, it was found that a deposited film having a small number of structural defects and preferable film quality could be obtained according to the present invention.

EXAMPLE 7

A light-receiving member for electrophotography was formed under the same conditions as in Example 1 except that the high-frequency power supply portion 102 in which the ceramics material 113 containing $Al_2O_3$ as a main component was plasma-sprayed by a thickness of 100 μm on the surface of a Ti base member 112 was used and the oscillation frequency of the high-frequency power supply 107 was 200 MHz.

The light-receiving member for electrophotography formed in Example 7 was evaluated with respect to a globular projection density, the number of white dots, and an image density reproducibility in the same procedures as in Example 1. The obtained results are shown in Table 5. As is apparent from Table 5, it was found that a deposited film having a small number of structural defects and preferable film quality could be obtained according to the present invention.

EXAMPLE 8

A light-receiving member for electrophotography was formed under the same conditions as in Example 1 except that the high-frequency power supply portion 102 in which the ceramics material 113 containing $TiO_2$ as a main component was arc-sprayed by a thickness of 30 μm on the surface of the Ti base member 112 was used.

The light-receiving member for electrophotography formed in Example 8 was evaluated with respect to a globular projection density, the number of white dots, and an image density reproducibility in the same procedures as in Example 1. The obtained results are shown in Table 5. As is apparent from Table 5, it was found that a deposited film having a small number of structural defects and preferable film quality could be obtained according to the present invention.

EXAMPLE 9

A light-receiving member for electrophotography was formed under the same conditions as in Example 2 except that the high-frequency power supply portion 102 in which the ceramics material 113 containing $Cr_2O_3$ as a main component was plasma-sprayed by a thickness of 100 μm on the surface of the stainless base member 112 was used and the oscillation frequency of the high-frequency power supply 107 was 50 MHz.

The light-receiving member for electrophotography formed in Example 9 was evaluated with respect to a globular projection density, the number of white dots, and an image density reproducibility in the same procedures as in Example 1. The obtained results are shown in Table 5. As is apparent from Table 5, it was found that a deposited film having a small number of structural defects and preferable film quality could be obtained according to the present invention.

EXAMPLE 10

A light-receiving member for electrophotography was formed under the same conditions as in Example 1 except that the high-frequency power supply portion 102 in which the ceramics material 113 containing MgO as a main component was plasma-sprayed by a thickness of 50 μm on the surface of the stainless base member 112 was used.

The light-receiving member for electrophotography formed in Example 10 was evaluated with respect to a globular projection density, the number of white dots, and an image density reproducibility in the same procedures as in Example 1. The obtained results are shown in Table 5. As is apparent from Table 5, it was found that a deposited film having a small number of structural defects and preferable film quality could be obtained according to the present invention.

EXAMPLE 11

A light-receiving member for electrophotography was formed under the same conditions as in Example 2 except that the high-frequency power supply portion 102 in which a ceramics cylinder 113 containing $Al_2O_3$ as a main component and having a thickness of 2 mm was covered on the surface of the stainless base member 112 was used and the oscillation frequency of the high-frequency power supply 107 was 105 MHz.

The light-receiving member for electrophotography formed in Example 11 was evaluated with respect to a globular projection density, the number of white dots, and an image density reproducibility in the same procedures as in Example 1. The obtained results are shown in Table 5. As is apparent from Table 5, it was found that a deposited film having a small number of structural defects and preferable film quality could be obtained according to the present invention.

EXAMPLE 12

In the deposited film forming apparatus shown in FIGS. 4A and 4B, by using the high-frequency power supply 207 having an oscillation frequency of 105 MHz and the high-frequency power supply portion 202 in which the ceramics material 215 containing $Al_2O_3$ as a main component was plasma-sprayed by a thickness of 50 μm on the surface of a stainless base member 214, an amorphous Si film was formed ten times on the aluminum cylindrical substrate 201 under the film formation conditions shown in Table 4, thereby forming a light-receiving member for electrophotography having the layer constitution shown in FIG. 6C.

Comparative Example 3

In this Comparative Example, an amorphous Si film was formed ten times in the same manner as in Example 12 except that the stainless high-frequency power supply portion 202 in which the ceramics material 215 containing $Al_2O_3$ as a main component was not plasma-sprayed on the surface, thereby forming a light-receiving member for electrophotography.

The light-receiving members for electrophotography formed in Example 12 and Comparative Example 3 were evaluated with respect to a globular projection density, the number of white dots, and an image density reproducibility in the same procedures as in Example 1. As a result, the light-receiving member for electrophotography of Example 12 had a globular projection density 0.79 times and the number of white dots 0.6 times those of the light-receiving member for electrophotography of Comparative Example 3, respectively, and image reproducibility more excellent than that of the light-receiving member for electrophotography of Comparative Example 3. Therefore, it was found that a deposited film having a small number of structural defects and preferable film quality could be formed according to the present invention.

TABLE 4

| Layer Constitution | Charge Injection Blocking Layer | Photo-conductive Layer | Surface Layer |
|---|---|---|---|
| Source Gas Flow Rate | | | |
| $SiH_4$ (sccm) | 300 | 350 | 46 |
| $H_2$ (sccm) | 2000 | 2000 | 2000 |
| $B_2H_6$ (ppm) (based on $SiH_4$) | 2000 | 2 | |
| $CH_4$ (sccm) | 30 | | 500 |
| Substrate Temperature (° C.) | 300 | 300 | 300 |
| Internal Pressure (Pa) | 3 | 3 | 3 |
| High-frequency Power (W) | 500 | 700 | 300 |
| Microwave Power (W) | 800 | 800 | 800 |
| Layer Thickness (μm) | 3 | 30 | 0.5 |

EXAMPLE 13

Figure 10A:
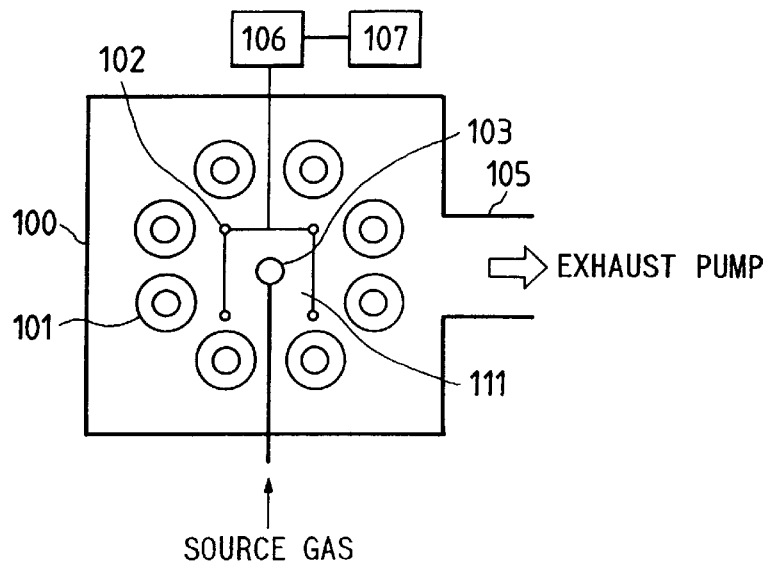
Figure 10B:
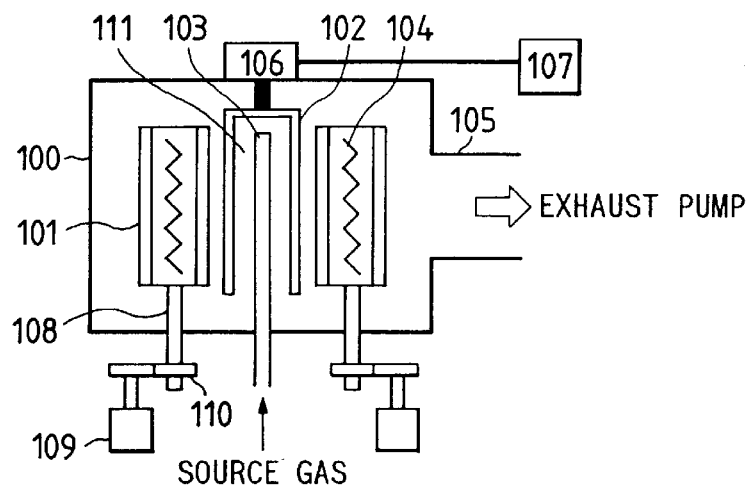
Figure 11A:
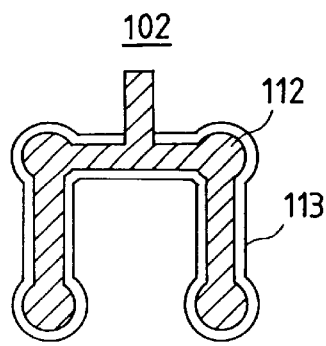
Figure 11B:
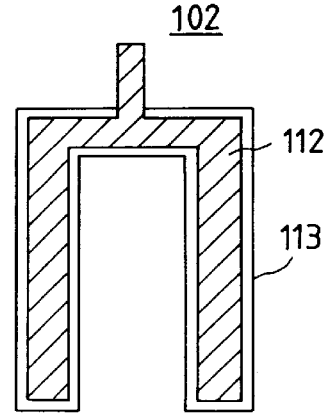

In the deposited film forming apparatus shown in FIGS. 10A and 10B, a light-receiving member for electrophotography was formed under the same conditions as in Example 1 except that a high-frequency power supply 107 having an oscillation frequency of 105 MHz was used and four high-frequency power supply portions 102 (as shown in FIGS. 11A and 11B) in which a ceramics material 113 containing $Al_2O_3$ was plasma-sprayed by a thickness of 50 μm on the surface of a stainless base member 112 was used.

The light-receiving member for electrophotography formed in Example 13 was evaluated with respect to a globular projection density, the number of white dots, and an image density reproducibility in the same procedures as in Example 1. The obtained results are shown in Table 5. As is apparent from Table 5, it was found that a deposited film having a small number of structural defects and preferable film quality could be obtained according to the present invention.

EXAMPLE 14

A light-receiving member for electrophotography was formed under the same conditions as in Example 1 except that the high-frequency power supply portion 102 in which the ceramics material 113 containing $Al_2O_3$ as a main component was plasma-sprayed by a thickness of 30 μm on the surface of the Al base member 112 was used and the oscillation frequency of the high-frequency power supply 107 was 200 MHz.

The light-receiving member for electrophotography formed in Example 14 was evaluated with respect to a globular projection density, the number of white dots, and an image density reproducibility in the same procedures as in Example 1. The obtained results are shown in Table 5. As is apparent from Table 5, it was found that a deposited film having a small number of structural defects and preferable film quality could be obtained according to the present invention.

EXAMPLE 15

A light-receiving member for electrophotography was formed under the same conditions as in Example 1 except that the high-frequency power supply portion 102 in which a ceramics cylinder material 113 containing $Al_2O_3$ as a main component and having a thickness of 5 mm was covered on the surface of the Ti base member 112 was used.

The light-receiving member for electrophotography formed in Example 15 was evaluated with respect to a globular projection density, the number of white dots, and an image density reproducibility in the same procedures as in Example 1. The obtained results are shown in Table 5. As is apparent from Table 5, it was found that a deposited film having a small number of structural defects and preferable film quality could be obtained according to the present invention.

EXAMPLE 16

A light-receiving member for electrophotography was formed under the same conditions as in Example 1 except that the high-frequency power supply portion 102 in which a ceramics cylinder 113 containing $Al_2O_3$ as a main component and having a thickness of 1 mm was covered on the surface of the Al base member 112 and the oscillation frequency of the high-frequency power supply 107 was 150 MHz was used.

The light-receiving member for electrophotography formed in Example 16 was evaluated with respect to a globular projection density, the number of white dots, and an image density reproducibility in the same procedures as in Example 1. The obtained results are shown in Table 5. As is apparent from Table 5, it was found that a deposited film having a small number of structural defects and preferable film quality could be obtained according to the present invention.

TABLE 5

|  | Globular Projection Density | Number of White Dots | Image Density Reproducibility |
| --- | --- | --- | --- |
| Example 3 | 0.78 | 0.64 | 1.18 |
| Example 4 | 0.74 | 0.68 | 1.19 |
| Example 5 | 0.77 | 0.71 | 1.24 |
| Example 6 | 0.71 | 0.69 | 1.22 |
| Example 7 | 0.74 | 0.65 | 1.17 |
| Example 8 | 0.79 | 0.66 | 1.20 |
| Example 9 | 0.78 | 0.69 | 1.19 |
| Example 10 | 0.77 | 0.65 | 1.16 |
| Example 11 | 0.72 | 0.66 | 1.23 |
| Example 13 | 0.76 | 0.66 | 1.17 |
| Example 14 | 0.72 | 0.68 | 1.21 |
| Example 15 | 0.75 | 0.67 | 1.22 |
| Example 16 | 0.79 | 0.71 | 1.19 |

Note: Table 5 shows relative values of the valued in Examples 3 to 16 when the values obtained Comparative Example 1 are regarded as 1.0.

EXAMPLE 17

Figure 12A:
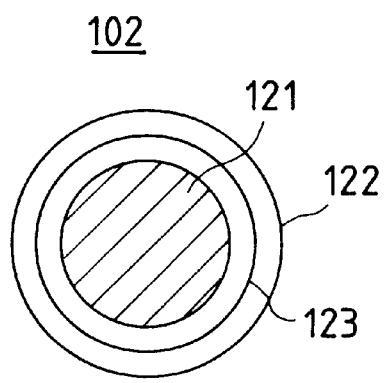
Figure 12B:
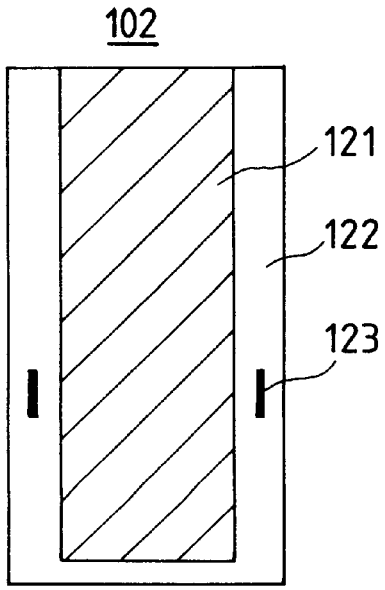

In a deposited film forming apparatus shown in FIGS. 2A and 2B, using a high-frequency power supply 107 having an oscillation frequency of 105 MHz, by using a high-frequency electrode 102 (FIGS. 12A and 12B) in which the surface of a stainless central conductor 121 was covered with a cylindrical covering layer 122 consisting of ceramics containing $Al_2O_3$ as a main component, having a thickness of 3 mm and including a ring-like annular conductor 123 having a length of 20 mm and consisting of stainless steel, an a-Si film having a thickness of about 1 μm was deposited, according to film formation conditions of a photoconductive layer shown in Table 6, on barium boron-silicated glass (available from Coning: 7059) arranged at each of 15 positions on an aluminum cylindrical substrate 101 in its axial direction, thereby manufacturing a conductivity distribution measuring sample.

In addition, an a-Si film having a thickness of about 1 μm was deposited, under the same film formation conditions as those of the conductivity distribution measuring sample, on a monocrystalline silicon substrate arranged at each of 15 positions on the aluminum cylindrical substrate 101 in its axial direction, thereby manufacturing an infrared absorption distribution measuring sample.

An a-Si film was formed on the aluminum cylindrical substrate 101 under the film formation conditions shown in Table 6, thereby manufacturing a light-receiving member for electrophotography having a layer constitution shown in FIG. 6C.

EXAMPLE 18

In Example 18, a conductive distribution measuring sample, an infrared absorption distribution measuring sample, and a light-receiving member for electrophotography were manufactured in the same manner as in Example 17 except that the covering layer 122 which does not include the annular conductor 123 was used.

The conductivity distribution measuring samples, the infrared absorption distribution measuring samples, and the light-receiving members for electrophotography manufactured in Examples 17 and 18 were evaluated in the following methods.

(1) Conductivity Distribution Evaluation

Chromium (Cr) was deposited on the surface of the a-Si layer of each conductivity distribution measuring sample to form comb-like electrodes. The conductivity distribution measuring sample was placed at a dark position, a voltage was applied across the comb-like electrodes by using a pA meter (available from Yokokawa Hewlett Packard: 4140B), and a dark current flowing between the comb-like electrodes was measured. A 5-mW He—Ne laser beam was irradiated to the comb-like electrode portion, and a bright current flowing between the comb-like electrodes was measured. On the basis of the ratio of the dark current to the bright current, conductivity was calculated. The average value of the conductivity of each sample was calculated, and the difference between the maximum value and the minimum value was divided by the average value, thereby calculating a conductivity distribution. A large average value of the conductivity indicates good photoconductivity and excellent film quality, and a small distribution value indicates excellent uniformity.

(2) Infrared Absorption Distribution Evaluation

Each infrared absorption distribution measuring sample was set in an infrared spectrophotometer (available from PERKIN ELMER: 1720-X), an infrared absorption spectrum of an Si—Hn (n=1 to 3) appearing near 2,000 $cm^{-1}$ was measured. The measured infrared absorption spectrum was waveform-separated into an infrared absorption spectrum of an Si—H radical near 2,000 $cm^{-1}$ and infrared absorption spectra of Si—$H_2$ and Si—$H_3$ radicals near 2,100 $cm^{-1}$. Ratio of the infrared absorption sectional areas (absorption sectional area near 2,000 $cm^{-1}$/absorption sectional area near 2,100 $cm^{-1}$) of these spectra was calculated. The average value of the ratio of infrared absorption sectional areas of each sample was calculated, and the difference between the maximum value and the minimum value was divided by the average value, thereby calculating an infrared absorption distribution. As the average value of the ratio of the infrared absorption sectional areas is large, the number of structural defects in the a-Si film caused by the Si—$H_2$ radical and the Si—H$_3$ radical are small, and excellent film quality can be obtained. A small distribution value indicates excellent uniformity.

(3) Image Density Distribution Evaluation

Each light receiving member for electrophotography was set in an electrophotographic apparatus (obtained by modifying NP6060 available from CANON INC. for an experiment), a full-halftone sheet available from CANON INC. (parts number: FY9-9042) was placed on an original table, and the corresponding light receiving member for electrophotography was copied. In the resultant copy image, image densities at 15 positions in the axial direction of the copy image (corresponding to the axial direction of the light-receiving member for electrophotography) were measured by an image densitometer (RD914 available from MACBETH). The average value of the image densities at the respective measurement positions was measured, and the difference between the maximum value and the minimum value was divided by the average value, thereby calculating an image density distribution. A small value of the image density distribution indicates that an image density having small ununiformity and excellent uniformity of image quality can be obtained.

(4) Memory Distribution Evaluation

Each light receiving member for electrophotography was set in an electrophotographic apparatus (obtained by modifying NP6060 available from CANON INC. for an experiment). A memory evaluating sheet in which a black sheet available from CANON INC. (parts number: FY9-9073) and a Canon genuine white coping paper (PB PAPER) each having a length of 5 cm were sequentially adhered to the leading portion of a full-halftone sheet available from CANON INC. (parts number: FY9-9042) was placed on an original table. A surface potentiometer (available from TREK: MODEL 344) was installed in place of a developing unit. Surface potentials at 15 positions on the light-receiving member for electrophotography in its axial direction were measured. In the measurement positions, of the surface potentials at positions corresponding to the halftone sheet, the difference between the surface potentials at positions corresponding to positions on the black sheet and white copying paper in exposure in the previous cycle of a copying process was calculated. This value was used as a memory potential. The average value of the memory potentials at the respective measurement positions was calculated, and the difference between the maximum value and the minimum value was divided by the average value, thereby calculating a memory distribution. As the average value of the memory potential is small, the uniformity of an image density is excellent, and image quality is improved. A small distribution value indicates excellent uniformity.

The above evaluations are shown in Table 7. Table 7 shows relative values of the evaluation results obtained in Example 17 when the evaluation results obtained in Example 18 are regarded as 1. As is apparent from Table 7, the samples and light-receiving member for electrophotography in Example 17 has distribution values of the conductivity, infrared absorption, image density, and memory potential which are smaller than those of the samples and light-receiving member for electrophotography in Example 18, the samples and light-receiving member for electrophotography in Example 17. The characteristic distribution in Example 17 is more uniform than that in Example 18, the average values of the conductivity and infrared absorption in Example 17 are larger than those in Example 18, and the film quality of the deposited film in Example 17 is improved. The average value of the memory potential in Example 17 is smaller than that in Example 18, and the image characteristics of the light-receiving member for electrophotography in Example 17 is improved.

According to the above results, when an annular conductor was used, a deposited film having more uniform characteristics and better film quality could be formed. Therefore, it was found that a light-receiving member for electrophotography having more excellent image characteristics could be formed.

TABLE 6

| Layer Constitution | Charge Injection Blocking Layer | Photo-conductive Layer | Surface Layer |
|---|---|---|---|
| Source Gas Flow Rate | | | |
| SiH$_4$ (sccm) | 300 | 300 | 30 |
| H$_2$ (sccm) | 1500 | 1500 | 0 |
| B$_2$H$_6$ (ppm) (based on SiH$_4$) | 1000 | 2 | 0 |
| NO (sccm) | 6 | 0 | 0 |
| CH$_4$ (sccm) | 0 | 0 | 400 |
| Substrate Temperature (° C.) | 250 | 250 | 250 |
| Internal Pressure (Pa) | 1 | 1 | 1 |
| High-frequency Power (W) | 4000 | 4000 | 1500 |
| Layer Thickness ($\mu$m) | 3 | 30 | 0.5 |

TABLE 7

| | Average Value | Distribution Value |
|---|---|---|
| Conductivity | 1.14 | 0.37 |
| Infrared Absorption | 1.08 | 0.73 |
| Image Density | — | 0.49 |
| Memory Potential | 0.93 | 0.61 |

Note: All the values in Table 7 are relative values of the values obtained in Example 17 when the values obtained in Example 18 are regarded as 1.

EXAMPLE 19

In Example 18, a conductive distribution measuring sample, an infrared absorption distribution measuring sample, and a light-receiving member for electrophotography were manufactured in the same manner as in Example 17 except that the covering layer 122 having a thickness shown in Table 8 and consisting of a material shown in Table 8 was used in place of the cylindrical covering layer 122 consisting of ceramics.

The conductivity distribution measuring sample, the infrared absorption distribution measuring sample, and the light-receiving member for electrophotography manufactured in Example 19 were evaluated in the same procedures as those of Example 17 with respect to a conductive distribution, an infrared absorption distribution, an image density distribution, and a memory distribution. The obtained results are shown in Table 8. As is apparent from Table 8, according to the present invention, a deposited film having uniform characteristics and good film quality could be formed. Therefore, it was found that a light-receiving member for electrophotography having excellent image characteristics could be formed.

TABLE 8

| Material | BN | AlN | ZrSiO$_4$ | ZrSiO$_4$—2MgO$_2$.Al$_2$O$_3$.5SiO$_2$ |
|---|---|---|---|---|
| Thickness (mm) | 5 | 10 | 2 | 1 |
| Conductivity | 0.39 | 0.41 | 0.35 | 0.33 |
| Infrared Absorption | 0.76 | 0.82 | 0.7 | 0.65 |
| Image Density | 0.52 | 0.53 | 0.46 | 0.45 |
| Memory Potential | 0.64 | 0.67 | 0.58 | 0.55 |

Note: All the values in Table 8 are relative values of the values obtained in Example 19 when the values obtained in Example 18 are regarded as 1.

EXAMPLE 20

Figure 13:
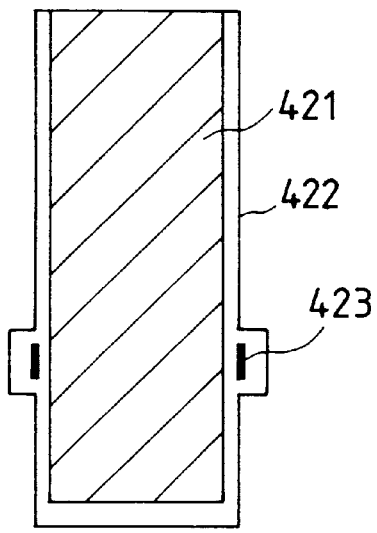

In Example 20, a conductive distribution measuring sample, an infrared absorption distribution measuring sample, and a light-receiving member for electrophotography were manufactured in the same manner as in Example 17 except that a high-frequency electrode 402 (shown in FIG. 13) in which a ceramics material containing Al$_2$O$_3$ as a main component was plasma-sprayed by a thickness of 50 μm on the surface of a stainless central conductor 421 to form a covering layer 422, a ring-like annular conductor 423 having a length of 15 mm and consisting of stainless steel was arranged on the covering layer 422, and a ceramics material containing Al$_2$O$_3$ as a main component was further plasma-sprayed by a thickness of 100 μm on the annular conductor 423 to form the covering layer 422 was used in place of the high-frequency electrode 102 used in Example 17.

The conductivity distribution measuring sample, the infrared absorption distribution measuring sample, and the light-receiving member for electrophotography manufactured in Example 20 were evaluated in the same procedures as those of Example 17 with respect to a conductive distribution, an infrared absorption distribution, an image density distribution, and a memory distribution. As a result, a conductivity distribution measuring sample, an infrared absorption distribution measuring sample, and a light-receiving member for electrophotography having the same characteristics as those of Example 17 could be obtained. According to the present invention, a deposited film having uniform characteristics and good film quality could be formed. Therefore, it was found that a light-receiving member for electrophotography having excellent image characteristics could be formed.

EXAMPLE 21

In Example 21, a conductive distribution measuring sample, an infrared absorption distribution measuring sample, and a light-receiving member for electrophotography were manufactured in the same manner as in Example 20 except that a ceramics material containing a material shown in Table 9 as a main component was plasma-sprayed by a thickness shown in Table 9 on the surface of the stainless central conductor 421 to form the covering layer 422, the annular conductor 423 was arranged on the covering layer 422 as in the same manner as in Example 20, and a ceramics material containing the same material as in Example 20 as a main component was further plasma-sprayed by a thickness of 100 μm on the annular conductor 423 to form the covering layer 422.

The conductivity distribution measuring sample, the infrared absorption distribution measuring sample, and the light-receiving member for electrophotography manufactured in Example 21 were evaluated in the same procedures as those of Example 20 with respect to a conductive distribution, an infrared absorption distribution, an image density distribution, and a memory distribution. The obtained results are shown in Table 9. As is apparent from Table 9, according to the present invention, a deposited film having uniform characteristics and good film quality could be formed. Therefore, it was found that a light-receiving member for electrophotography having excellent image characteristics could be formed.

TABLE 9

| Material | Al$_2$O$_3$.TiO$_2$ | TiO$_2$ | Cr$_2$O$_3$ | MgO |
|---|---|---|---|---|
| Thickness (μm) | 100 | 200 | 30 | 50 |
| Conductivity | 0.4 | 0.4 | 0.36 | 0.32 |
| Infrared Absorption | 0.75 | 0.84 | 0.71 | 0.64 |
| Image Density | 0.53 | 0.52 | 0.45 | 0.46 |
| Memory Potential | 0.63 | 0.68 | 0.57 | 0.56 |

Note: All the values in Table 9 are relative values of the values obtained in Example 21 when the values obtained in Example 18 are regarded as 1.

EXAMPLE 22

In Example 22, a conductive distribution measuring sample, an infrared absorption distribution measuring sample, and a light-receiving member for electrophotography were manufactured in the same manner as in Example 17 except that the annular conductor 123 consisting of a material shown in Table 10 was used.

The conductivity distribution measuring sample, the infrared absorption distribution measuring sample, and the light-receiving member for electrophotography manufactured in Example 22 were evaluated in the same procedures as those of Example 17 with respect to a conductive distribution, an infrared absorption distribution, an image density distribution, and a memory distribution. The obtained results are shown in Table 10. As is apparent from Table 10, according to the present invention, a deposited film having uniform characteristics and good film quality could be formed. Therefore, it was found that a light-receiving member for electrophotography having excellent image characteristics could be formed.

TABLE 10

| | Ni | Al | Ti | Inconel |
|---|---|---|---|---|
| Conductivity | 0.42 | 0.44 | 0.38 | 0.35 |
| Infrared Absorption | 0.79 | 0.88 | 0.75 | 0.67 |
| Image Density | 0..56 | 0.55 | 0.5 | 0.48 |
| Memory | 0.66 | 0.71 | 0.63 | 0.62 |

Note: All the values in Table 10 are relative values of the values obtained in Example 22 when the values obtained in Example 18 are regarded as 1.

EXAMPLE 23

Figure 14:
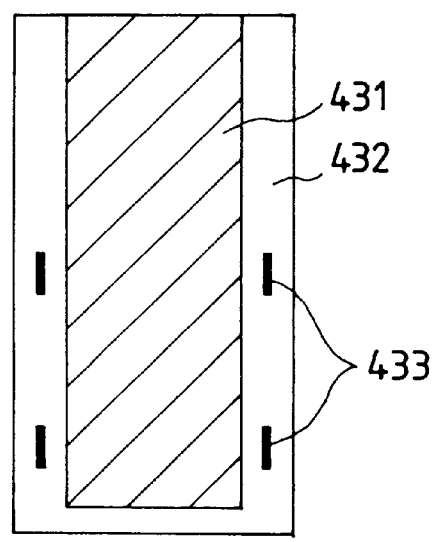

In Example 23, a conductive distribution measuring sample, an infrared absorption distribution measuring sample, and a light-receiving member for electrophotography were manufactured in the same manner as in Example 17 except that the high-frequency electrode 102 (shown in FIG. 14) in which two ring-like annular conductors 433 consisting of stainless steel were included in a covering layer 432 formed around a stainless central conductor 431 was used in place of the high-frequency electrode 102 used in Example 17.

The conductivity distribution measuring sample, the infrared absorption distribution measuring sample, and the light-receiving member for electrophotography manufactured in Example 23 were evaluated in the same procedures as those of Example 17 with respect to a conductive distribution, an infrared absorption distribution, an image density distribution, and a memory distribution. As a result, a conductivity distribution measuring sample, an infrared absorption distribution measuring sample, and a light-receiving member for electrophotography having the same characteristics as those of Example 17 could be obtained. According to the present invention, a deposited film having uniform characteristics and good film quality could be formed. Therefore, it was found that a light-receiving member for electrophotography having excellent image characteristics could be formed.

EXAMPLE 24

Figure 15A:
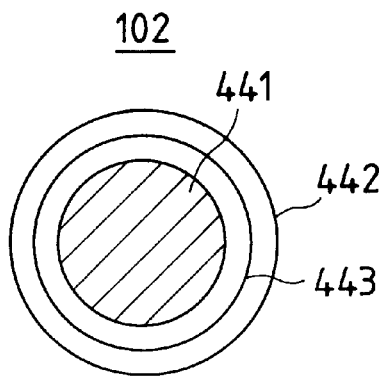
Figure 15B:
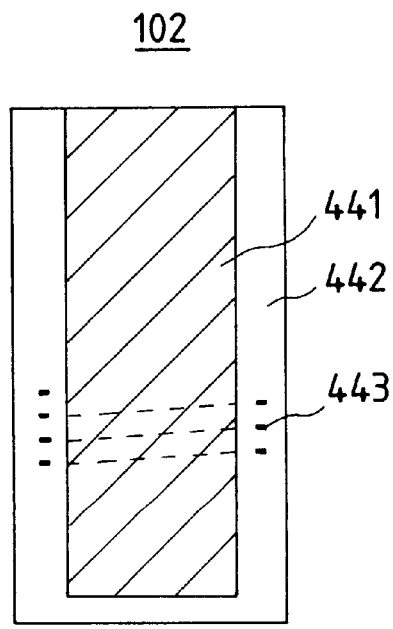

In Example 24, a conductive distribution measuring sample, an infrared absorption distribution measuring sample, and a light-receiving member for electrophotography were manufactured in the same manner as in Example 17 except that the high-frequency electrode 102 (shown in FIGS. 15A and 15B) in which a spiral annular conductor 443 consisting of stainless steel was included in a covering layer 442 formed around a stainless central conductor 441 was used in place of the high-frequency electrode 102 used in Example 17.

The conductivity distribution measuring sample, the infrared absorption distribution measuring sample, and the light-receiving member for electrophotography manufactured in Example 24 were evaluated in the same procedures as those of Example 17 with respect to a conductive distribution, an infrared absorption distribution, an image density distribution, and a memory distribution. As a result, a conductivity distribution measuring sample, an infrared absorption distribution measuring sample, and a light-receiving member for electrophotography having the same characteristics as those of Example 17 could be obtained. According to the present invention, a deposited film having uniform characteristics and good film quality could be formed. Therefore, it was found that a light-receiving member for electrophotography having excellent image characteristics could be formed.

EXAMPLE 25

Figure 16:
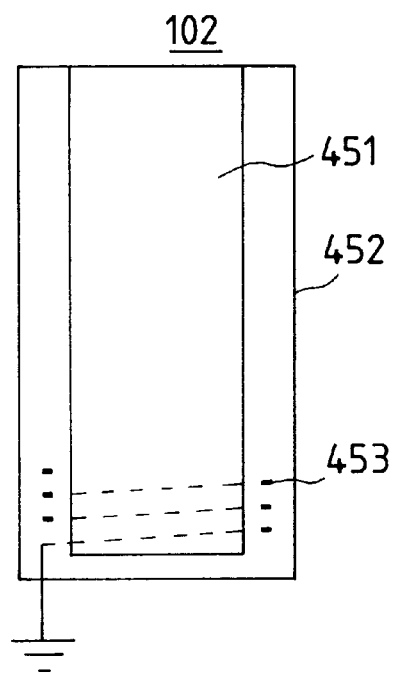

In Example 25, a conductive distribution measuring sample, an infrared absorption distribution measuring sample, and a light-receiving member for electrophotography having a layer constitution shown in FIG. 6E were manufactured in the same manner as in Example 17 except that the high-frequency electrode 102 (shown in FIG. 16) in which a spiral annular conductor 453 grounded and consisting of stainless steel was included in a covering layer 452 formed around a stainless central conductor 451 was used in place of the high-frequency electrode 102 used in Example 17, and film formation was performed under film formation conditions shown in Table 11.

EXAMPLE 26

In Example 26, a conductive distribution measuring sample, an infrared absorption distribution measuring sample, and a light-receiving member for electrophotography having were manufactured in the same manner as in Example 25 except that the covering layer 452 in which the annular conductor 453 was not included was used.

The conductivity distribution measuring samples, the infrared absorption distribution measuring samples, and the light-receiving members for electrophotography manufactured in Examples 25 and 26 were evaluated in the same procedures as those of Example 17 with respect to a conductive distribution, an infrared absorption distribution, an image density distribution, and a memory distribution. The obtained results are shown in Table 12. Table 12 shows relative values of the evaluation results obtained in Example 25 when the evaluation results obtained in Example 26 are regarded as 1. As is apparent from Table 12, the samples and light-receiving member for electrophotography obtained in Example 25 are more excellent than the samples and light-receiving member for electrophotography obtained in Example 26 with respect to any evaluation. In Example 25, a deposited film having more uniform characteristics and better film quality could be formed. Therefore, it was found that a light-receiving member for electrophotography having more excellent image characteristics could be formed.

TABLE 11

| Layer Constitution | Charge Injection Blocking Layer | Photo-conductive Layer | Upper Blocking Layer | Surface Layer |
| --- | --- | --- | --- | --- |
| Source Gas Flow Rate | | | | |
| $SiH_4$ (sccm) | 300 | 200 | 100 | 30 |
| He (sccm) | 1000 | 1000 | 500 | 0 |
| $B_2H_6$ (ppm) (based on $SiH_4$) | 0 | 0.5 | 300 | 0 |
| $PH_3$ (ppm) (based on $SiH_4$) | 1000 | 0 | 0 | 0 |
| NO (sccm) | 3 | 0 | 0 | 0 |
| $CH_4$ (sccm) | 0 | 0 | 100 | 400 |
| Substrate Temperature (° C.) | 300 | 300 | 270 | 250 |
| Internal Pressure (Pa) | 2 | 0.5 | 0.5 | 1 |
| High-frequency Power (W) | 3000 | 1500 | 4000 | 1500 |
| Layer Thickness (μm) | 1 | 22 | 0.1 | 0.5 |

TABLE 12

| | Average Value | Distribution Value |
| --- | --- | --- |
| Conductivity | 1.08 | 0.39 |
| Infrared Absorption | 1.10 | 0.69 |
| Image Density | — | 0.44 |
| Memory Potential | 0.95 | 0.65 |

Note: All the values in Table 12 are relative values of the values obtained in Example 25 when the values obtained in Example 26 are regarded as 1.

EXAMPLE 27

In Example 27, a conductive distribution measuring sample, an infrared absorption distribution measuring sample, and a light-receiving member for electrophotography were manufactured in the same manner as in Example 17 except that the central conductor 121 consisted of a material shown in Table 13.

The conductivity distribution measuring sample, the infrared absorption distribution measuring sample, and the light-receiving member for electrophotography manufactured in Example 27 were evaluated in the same procedures as those of Example 17 with respect to a conductive distribution, an infrared absorption distribution, an image density distribution, and a memory distribution. The obtained results are shown in Table 13. As is apparent from Table 13, according to the present invention, a deposited film having uniform characteristics and good film quality could be formed. Therefore, it was found that a light-receiving member for electrophotography having excellent image characteristics could be formed.

TABLE 13

|  | Ni | Al | Ti | Inconel |
|---|---|---|---|---|
| Conductivity | 0.4 | 0.46 | 0.41 | 0.33 |
| Infrared Absorption | 0.71 | 0.92 | 0.8 | 0.62 |
| Image Density | 0.53 | 0.6 | 0.54 | 0.45 |
| Memory | 0.63 | 0.75 | 0.72 | 0.54 |

Note: All the values in Table 13 are relative values of the values obtained in Example 27 when the values obtained in Example 18 are regarded as 1.

EXAMPLE 28

Figure 17A:
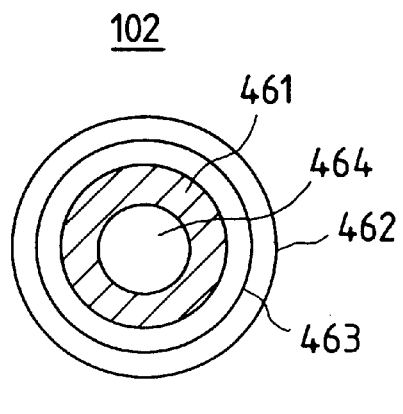
Figure 17B:
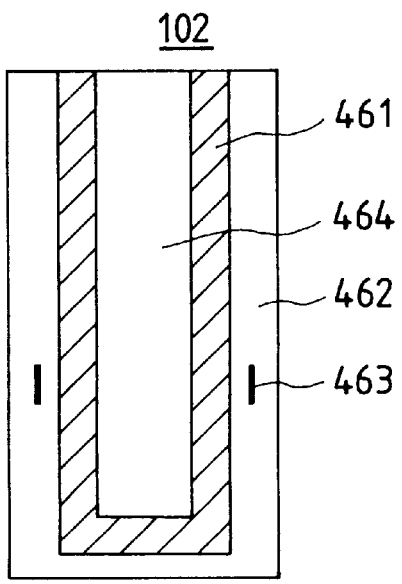

In Example 28, a conductive distribution measuring sample, an infrared absorption distribution measuring sample, and a light-receiving member for electrophotography were manufactured in the same manner as in Example 17 except that the high-frequency electrode 102 (shown in FIGS. 17A and 17B) in which a stainless central conductor 461 incorporated with a sheath heater 464 was used was used in place of the high-frequency electrode 102 used in Example 17, and the high-frequency electrode 102 was heated to 200° C.

The conductivity distribution measuring sample, the infrared absorption distribution measuring sample, and the light-receiving member for electrophotography manufactured in Example 28 were evaluated in the same procedures as those of Example 17 with respect to a conductive distribution, an infrared absorption distribution, an image density distribution, and a memory distribution. As a result, a conductivity distribution measuring sample, an infrared absorption distribution measuring sample, and a light-receiving member for electrophotography having the same characteristics as those of Example 17 could be obtained. According to the present invention, a deposited film having uniform characteristics and good film quality could be formed. Therefore, it was found that a light-receiving member for electrophotography having excellent image characteristics could be formed.

EXAMPLE 29

In Example 29, a conductive distribution measuring sample, an infrared absorption distribution measuring sample, and a light-receiving member for electrophotography were manufactured in the same manner as in Example 17 except that the high-frequency electrode 102 (shown in FIGS. 17A and 17B) in which the stainless central conductor 461 incorporated with a water-cooled pipe 464 was used in place of the central conductor 461 incorporated with the sheath heater 464 was used in place of the high-frequency electrode 102 used in Example 17, and the high-frequency electrode 102 was heated to 40° C.

The conductivity distribution measuring sample, the infrared absorption distribution measuring sample, and the light-receiving member for electrophotography manufactured in Example 29 were evaluated in the same procedures as those of Example 17 with respect to a conductive distribution, an infrared absorption distribution, an image density distribution, and a memory distribution. As a result, a conductivity distribution measuring sample, an infrared absorption distribution measuring sample, and a light-receiving member for electrophotography having the same characteristics as those of Example 17 could be obtained. According to the present invention, a deposited film having uniform characteristics and good film quality could be formed. Therefore, it was found that a light-receiving member for electrophotography having excellent image characteristics could be formed.

EXAMPLE 30

Figure 18A:
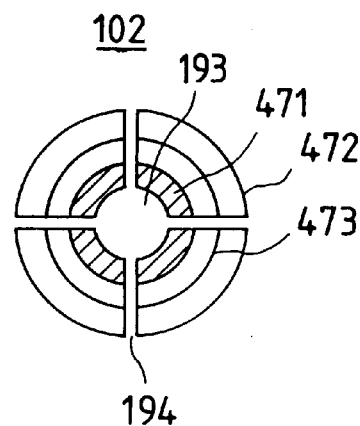
Figure 18B:
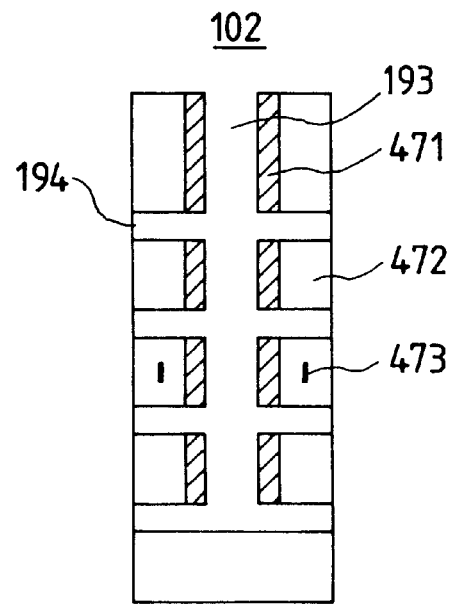

In Example 30, a conductive distribution measuring sample, an infrared absorption distribution measuring sample, and a light-receiving member for electrophotography were manufactured in the same manner as in Example 17 except that the high-frequency electrode 102 (shown in FIGS. 18A and 18B) which also served as a source gas supply portion was used in place of the high-frequency electrode and the source gas supply portion used in Example 17, and film formation was performed under film formation conditions shown in Table 14. As shown in FIGS. 18A and 18B, the high-frequency electrode 102 has an annular conductor 473. A gas supply path 193 communicates with a large number of gas discharge holes 194. Reference numeral 471 denotes a conductive electrode consisting of stainless steel or the like.

EXAMPLE 31

In Example 31, a conductive distribution measuring sample, an infrared absorption distribution measuring sample, and a light-receiving member for electrophotography having were manufactured in the same manner as in Example 30 except that a covering layer 472 in which an annular conductor 473 was not included was used.

The conductivity distribution measuring samples, the infrared absorption distribution measuring samples, and the light-receiving members for electrophotography manufactured in Examples 30 and 31 were evaluated in the same procedures as those of Example 17 with respect to a conductive distribution, an infrared absorption distribution, an image density distribution, and a memory distribution. The obtained results are shown in Table 15. Table 15 shows relative values of the evaluation results obtained in Example 30 when the evaluation results obtained in Example 31 are regarded as 1. As is apparent from Table 15, the samples and light-receiving member for electrophotography obtained in Example 30 are more excellent than the samples and light-receiving member for electrophotography obtained in Example 31 with respect to any evaluation. When the annular conductor is formed in the covering layer, a deposited film having more uniform characteristics and better film quality could be formed. Therefore, it was found that a light-receiving member for electrophotography having excellent image characteristics could be formed.

TABLE 14

| Layer Constitution | Charge Injection Blocking Layer | Photo-conductive Layer | Surface Layer |
|---|---|---|---|
| Source Gas Flow Rate | | | |
| SiH$_4$ (sccm) | 200 | 200 | 25 |
| H$_2$ (sccm) | 2000 | 2000 | 0 |
| B$_2$H$_6$ (ppm) (based on SiH$_4$) | 2000 | 3 | 0 |
| NO (sccm) | 5 | 0 | 0 |
| CH$_4$ (sccm) | 0 | 0 | 350 |
| Substrate Temperature (° C.) | 310 | 250 | 280 |
| Internal Pressure (Pa) | 3 | 3 | 4 |
| High-frequency Power (W) | 1500 | 1300 | 1000 |
| Layer Thickness ($\mu$m) | 3 | 30 | 0.5 |

TABLE 15

| | Average Value | Distribution Value |
|---|---|---|
| Conductivity | 1.12 | 0.41 |
| Infrared Absorption | 1.06 | 0.75 |
| Image Density | — | 0.47 |
| Memory Potential | 0.9 | 0.66 |

Note: All the values in Table 15 are relative values of the values obtained in Example 30 when the values obtained in Example 31 are regarded as 1.

EXAMPLE 32

Figure 19A:
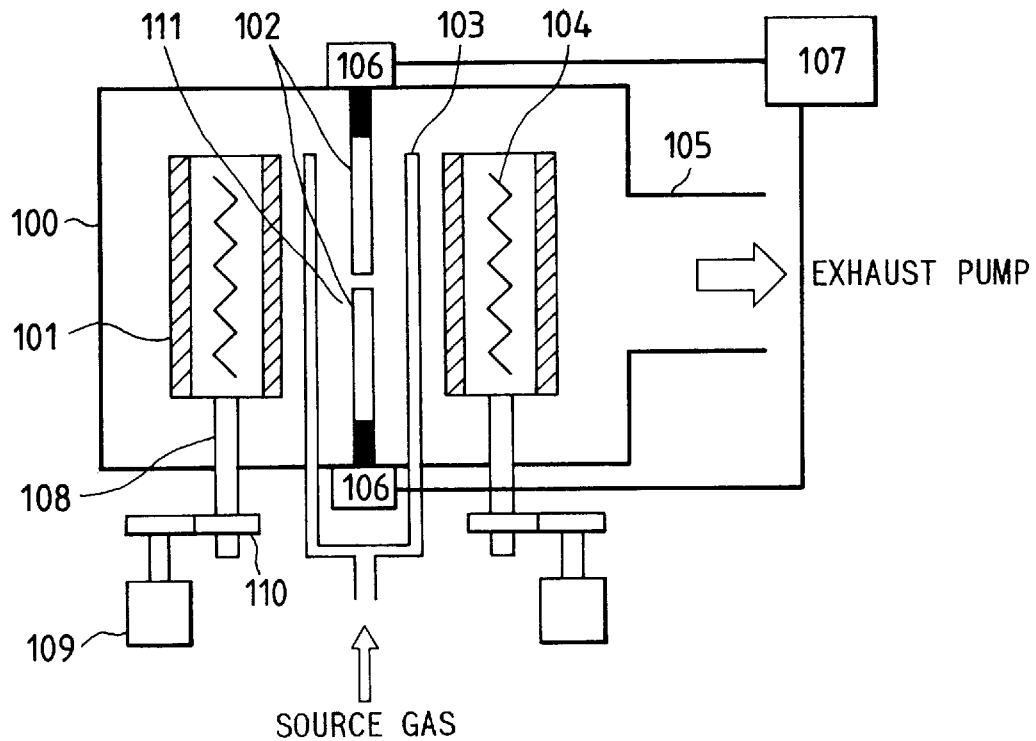
Figure 19B:
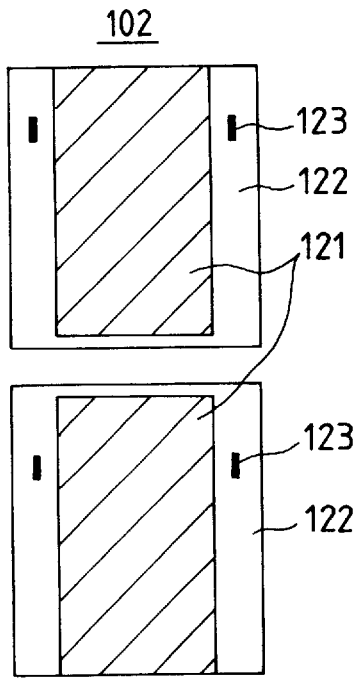

In Example 32, a conductive distribution measuring sample, an infrared absorption distribution measuring sample, and a light-receiving member for electrophotography were manufactured in the same manner as in Example 17 except that a deposited film forming apparatus having a plurality of high-frequency electrodes 102 (shown in FIGS. 19A and 19B) was in place of the high-frequency electrode 102 used in Example 17.

The conductivity distribution measuring sample, the infrared absorption distribution measuring sample, and the light-receiving member for electrophotography manufactured in Example 32 were evaluated in the same procedures as those of Example 17 with respect to a conductive distribution, an infrared absorption distribution, an image density distribution, and a memory distribution. As a result, a conductivity distribution measuring sample, an infrared absorption distribution measuring sample, and a light-receiving member for electrophotography having the same characteristics as those of Example 17 could be obtained. According to the present invention, a deposited film having uniform characteristics and good film quality could be formed. Therefore, it was found that a light-receiving member for electrophotography having excellent image characteristics could be formed.

EXAMPLE 33

In Example 33, a conductive distribution measuring sample, an infrared absorption distribution measuring sample, and a light-receiving member for electrophotography were manufactured in the same manner as in Example 17 except that the oscillation frequency of the high-frequency power supply 107 was changed into an oscillation frequency shown in Table 16.

EXAMPLE 34

In Example 34, a conductive distribution measuring sample, an infrared absorption distribution measuring sample, and a light-receiving member for electrophotography were manufactured in the same manner as in Example 17 except that the oscillation frequency of the high-frequency power supply 107 was changed into 13.56 MHz.

EXAMPLE 35

In Example 35, a conductive distribution measuring sample, an infrared absorption distribution measuring sample, and a light-receiving member for electrophotography were manufactured in the same manner as in Example 17 except that the oscillation frequency of the high-frequency power supply 107 was changed into 500 MHz.

The conductivity distribution measuring samples, the infrared absorption distribution measuring samples, and the light-receiving members for electrophotography manufactured in Examples 33 to 35 were evaluated in the same procedures as those of Example 17 with respect to a conductive distribution, an infrared absorption distribution, an image density distribution, and a memory distribution. The obtained results are shown in Table 16. Table 16 shows relative values of the evaluation results obtained in Examples 33 and 35 when the evaluation results obtained in Example 34 are regarded as 1. As is apparent from Table 16, the samples and light-receiving member for electrophotography obtained in Example 33 are more excellent than the samples and light-receiving member for electrophotography obtained in Examples 34 and 35 with respect to any evaluation. In Example 33, a deposited film having more uniform characteristics and better film quality could be formed. Therefore, it was found that a light-receiving member for electrophotography having excellent image characteristics could be formed.

TABLE 16

| Oscillation Frequency | 20 MHz | 50 MHz | 80 MHz | 200 MHz | 450 MHz | 500 MHz (Ex. 35) |
|---|---|---|---|---|---|---|
| Conductivity | 0.66 | 0.49 | 0.46 | 0.48 | 0.51 | 0.83 |
| Infrared Absorption | 0.86 | 0.8 | 0.79 | 0.78 | 0.82 | 0.95 |
| Image Density | 0.71 | 0.61 | 0.6 | 0.6 | 0.63 | 0.88 |
| Memory | 0.79 | 0.7 | 0.69 | 0.71 | 0.72 | 0.9 |

Note: All the values in Table 16 are relative values of the values obtained in Example 33 and 35 when the values obtained in Example 34 are regarded as 1.

EXAMPLE 36

A conductive distribution measuring sample, an infrared absorption distribution measuring sample, and a light-receiving member for electrophotography having a layer constitution shown in FIG. 6D were manufactured in the same manner as in Example 17 except that the deposited film forming apparatus shown in FIGS. 4A and 4B was used, the same high-frequency electrode 102 as that of Example 17 was used, and film formation was performed under the film formation conditions shown in Table 17.

EXAMPLE 37

In Example 37, a conductive distribution measuring sample, an infrared absorption distribution measuring sample, and a light-receiving member for electrophotography were manufactured in the same manner as in Example 36 except that the same high-frequency electrode 102 as that of Example 18 was used.

The conductivity distribution measuring samples, the infrared absorption distribution measuring samples, and the light-receiving members for electrophotography manufactured in Examples 36 and 37 were evaluated in the same procedures as those of Example 17 with respect to a conductive distribution, an infrared absorption distribution, an image density distribution, and a memory distribution. The obtained results are shown in Table 18. Table 18 shows relative values of the evaluation results obtained in Example 36 when the evaluation results obtained in Example 37 are regarded as 1. As is apparent from Table 18, the samples and light-receiving member for electrophotography obtained in Example 36 are more excellent than the samples and light-receiving member for electrophotography obtained in Example 37 with respect to any evaluation. In Example 36, a deposited film having more uniform characteristics and better film quality could be formed. Therefore, it was found that a light-receiving member for electrophotography having more excellent image characteristics could be formed.

TABLE 17

| Layer Constitution | Charge Injection Blocking Layer | Charge Transfer Layer | Charge Generation Layer | Surface Layer |
|---|---|---|---|---|
| Source Gas Flow Rate | | | | |
| $SiH_4$ (sccm) | 300 | 400 | 300 | 40 |
| He (sccm) | 2000 | 2000 | 2000 | 2000 |
| $B_2H_6$ (ppm) (based on $SiH_4$) | 2000 | 3 | 1 | |
| $CH_4$ (sccm) | 100 | 80 | 0 | 500 |
| Substrate Temperature (° C.) | 300 | 300 | 270 | 300 |
| Internal Pressure (Pa) | 2 | 2 | 1.5 | 3 |
| High-frequency Power (W) | 1500 | 1500 | 1000 | 500 |
| Microwave Power (W) | 600 | 800 | 600 | 800 |
| Layer Thickness ($\mu$m) | 3 | 25 | 2 | 0.5 |

TABLE 18

| | Average Value | Distribution Value |
|---|---|---|
| Conductivity | 1.06 | 0.62 |
| Infrared Absorption | 1.02 | 0.81 |
| Image Density | — | 0.72 |
| Memory Potential | 0.95 | 0.77 |

Note: All the values in Table 18 are relative values of the values obtained in Example 36 when the values obtained in Example 37 are regarded as 1.

As has been described above, according to the present invention, a deposited film forming apparatus capable of reducing structural defects of a deposited film in number and an electrode for use in the deposited film forming apparatus can be provided.

The present invention can provide a deposited film forming apparatus preferably used to manufacture a light-receiving member for electrophotography having excellent image characteristics and an electrode for use in the deposited film forming apparatus.

The present invention can provide a deposited film forming apparatus capable of forming a deposited film which is excellent in characteristic uniformity, film characteristics, or quality, and an electrode for use in the deposited film forming apparatus.

In addition, the present invention can provide a deposited film forming apparatus in which a deposited film is free from or substantially free from a film thickness distribution, film formation can be stably performed, as a result, the production cost can be reduced, and film formation having a high cost-performance ratio can be performed, and an electrode for use in the deposited film forming apparatus.

The present invention is not limited to the above description, drawings, and examples. Various modifications and combinations can be effected without departing from the spirit and scope of the invention as a matter of course.

What is claimed is:

1. A deposited film forming apparatus comprising a reaction vessel which can hold a substrate therein and have a reduced internal pressure, means for supplying a source gas into said reaction vessel, and high-frequency power supply means including a high frequency power supply portion for supplying a high-frequency power to decompose the source gas in said reaction vessel, wherein said high-frequency power supply portion comprises a conductive member serving as a base member and a ceramics material covering the surface of the conductive member, wherein a surface of said high frequency portion is in said reaction vessel.

2. A deposited film forming apparatus according to claim 1, wherein said high-frequency power supply portion is also used as a source gas supply means.

3. A deposited film forming apparatus according to claim 1, wherein the ceramics material of said high-frequency power supply portion is at least one selected from the group consisting of $Al_2O_3$, BN, AlN, $ZrSiO_4$, $TiO_2$, $Cr_2O_3$, and MgO.

4. A deposited film forming apparatus according to claim 1, wherein the ceramics material is adhered to the conductive member by plasma spraying.

5. A deposited film forming apparatus according to claim 1, wherein a mechanism for heating or cooling said high-frequency power supply portion is arranged.

6. A deposited film forming apparatus according to claim 1, wherein said conductive member of said high-frequency power supply portion is selected from the group consisting of metals such as Al, Fe, Ni, Cr, Ti, Mo, Au, In, Nb, Te, V, Pt, and Pb and an alloy containing these metals.

7. A deposited film forming apparatus according to claim 1, wherein said conductive member of said high-frequency power supply portion is at least one selected from the group consisting of stainless steel and Inconel.

8. A deposited film forming apparatus according to claim 1, wherein a mechanism for rotating said substrate is arranged.

9. A deposited film forming apparatus according to claim 1, wherein said conductive member has a hollow portion and a hole communicating with the hollow portion.

10. A deposited film forming apparatus according to claim 1, wherein said high-frequency power supply means is provided in plural.

11. A deposited film forming apparatus according to claim 1, wherein said high-frequency power supply means supplies a frequency of 20 MHz to 450 MHz.

12. A deposited film forming apparatus according to claim 11, wherein said high-frequency power supply portion is also used as a source gas supply means.

13. A deposited film forming apparatus according to claim 1, further comprising means for supplying a microwave power into said reaction vessel.

14. A deposited film forming apparatus according to claim 13, wherein the microwave power is supplied into a space formed by arranging said substrate.

15. A deposited film forming apparatus according to claim 1, wherein a plurality of substrates is provided.

16. A deposited film forming apparatus according to claim 15, wherein said plurality of substrates can be arranged on a concentric circle.

17. A deposited film forming apparatus comprising:

a reaction vessel which can hold a substrate therein and have a reduced internal pressure;

means for supplying source gas into said reaction vessel; and high-frequency power supply means including a high frequency power supply portion for supplying into said reaction vessel a high frequency power to decompose the source gas, wherein said high frequency power supply portion comprises a conductive central conductor, an insulating member covering said conductive central conductor and an annular conductor surrounding said conductive central conductor and insulated from said central conductor by said insulating member.

18. A deposited film forming apparatus according to claim 17, wherein said insulating member is a material having high adhesion to a deposited film.

19. A deposited film forming apparatus according to claim 17, wherein said conductive central conductor is selected from the group consisting of metals such as Al, Fe, Ni, Cr, Ti, Mo, Au, In, Nb, Te, V, Pt, and Pb and an alloy containing these metals.

20. A deposited film forming apparatus according to claim 17, wherein said central conductor is selected from the group consisting of stainless steel and Inconel.

21. A deposited film forming apparatus according to claim 17, wherein said annular conductor has a ring-like shape.

22. A deposited film forming apparatus according to claim 17, wherein said annular conductor has a spiral shape.

23. A deposited film forming apparatus according to claim 17, wherein said annular conductor is provided in plural.

24. A deposited film forming apparatus according to claim 17, wherein said annular conductor is grounded.

25. A deposited film forming apparatus according to claim 17, wherein said annular conductor is selected from the group consisting of metals such as Al, Fe, Ni, Cr, Ti, Mo, Au, In, Nb, Te, V, Pt, and Pb and an alloy containing these metals.

26. A deposited film forming apparatus according to claim 17, wherein said annular conductor is selected from the group consisting of stainless steel and Inconel.

27. A deposited film forming apparatus according to claim 17, wherein said annular conductor has a hollow portion and a hole communicating with the hollow portion.

28. An electrode according to claim 17, wherein said annular conductor is selected from the group consisting of metals such as Al, Fe, Ni, Cr, Ti, Mo, Au, In, Nb, Te, V, Pt, and Pb and an alloy containing these metals.

29. An electrode according to claim 17, wherein said annular conductor is selected from the group consisting of stainless steel and Inconel.

30. A deposited film forming apparatus according to claim 17, wherein said insulating member is a ceramics material.

31. A deposited film forming apparatus according to claim 30, wherein the ceramics material is selected from the group consisting of $Al_2O_3$, BN, AlN, $ZrSiO_4$, $TiO_2$, $Cr_2O_3$, and MgO.

32. A deposited film forming apparatus according to claim 30, wherein the ceramics material is formed by plasma spraying.

33. An electrode for high frequency power supply for use in a vacuum apparatus capable of forming a deposition film on a substrate by decomposing a source gas introduced into a reaction vessel by means of supplying a high frequency power to said source gas, wherein said electrode comprises a matrix formed of a conductive material and an insulating material covering said conductive material, and said electrode is arranged in said reaction vessel.

34. An electrode according to claim 33, wherein said conductive material is selected from the group consisting of metals such as Al, Fe, Ni, Cr, Ti, Mo, Au, In, Nb, Te, V, Pt, and Pb and an alloy containing these metals.

35. An electrode according to claim 33, wherein said conductive material is selected from the group consisting of stainless steel and Inconel.

36. An electrode according to claim 33, wherein the conductive material has a hollow portion.

37. An electrode according to claim 36, wherein the conductive material further has a hole for causing the hollow portion to communicate with an external portion.

38. An electrode according to claim 33, wherein an annular conductor is arranged to surround the conductive material and to be insulated from the conductive material.

39. An electrode according to claim 38, wherein said annular conductor has a ring-like shape.

40. An electrode according to claim 38, wherein said annular conductor has a spiral shape.

41. An electrode according to claim 38, wherein said annular conductor is provided in plural.

42. An electrode according to claim 38, wherein said annular conductor can be grounded.

43. An electrode according to claim 38, wherein the conductive material has a hollow portion.

44. An electrode according to claim 43, wherein the conductive material further has a hole for causing the hollow portion to communicate with an external portion.

45. An electrode according to claim 38, wherein the insulating material is a ceramics material.

46. An electrode according to claim 45, wherein the ceramics material is selected from the group consisting of $Al_2O_3$, BN, AlN, $ZrSiO_4$, $TiO_2$, $Cr_2O_3$, and MgO.

47. An electrode according to claim 45, wherein the ceramics material is formed by plasma spraying.

* * * * *